US012777764B2

(12) United States Patent
Park

(10) Patent No.: US 12,777,764 B2
(45) Date of Patent: Oct. 27, 2026

(54) DISPLAY DEVICE

(71) Applicant: Samsung Display Co., LTD., Yongin-si (KR)

(72) Inventor: Do Yeong Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 359 days.

(21) Appl. No.: 18/408,953

(22) Filed: Jan. 10, 2024

(65) Prior Publication Data

US 2024/0258360 A1 Aug. 1, 2024

(30) Foreign Application Priority Data

Jan. 31, 2023 (KR) ........................ 10-2023-0013085

(51) Int. Cl.
*H01L 27/15* (2006.01)
*H10H 29/14* (2025.01)

(52) U.S. Cl.
CPC ................................. *H10H 29/142* (2025.01)

(58) Field of Classification Search
CPC ... G09G 2300/0426; G09G 2300/0408; G09G 2300/0842; G09G 2300/0452; G09G 2300/0456; G09G 2300/026; G09G 3/3648; G09G 3/32; G09G 3/36; G09G 3/3655; G09G 3/3614; G09G 3/3406; G09G 3/3677; G09G 3/3233; G09G 3/3607; G09G 3/3611; G09G 3/3426; G09G 3/3659; G09G 3/3688; G09G 3/3413; G09G 3/3208; G09G 3/003; G09G 2320/0233; G09G 2320/028; G09G 2320/0626; G09G 2360/144; G09G 2310/0286; G09G 2310/08
See application file for complete search history.

(56) References Cited

U.S. PATENT DOCUMENTS

| | | | | |
|---|---|---|---|---|
| 2011/0089850 | A1 | 4/2011 | Shibata et al. | |
| 2020/0273397 | A1* | 8/2020 | Jeong | G09G 3/32 |
| 2021/0273131 | A1* | 9/2021 | Kang | G09G 3/32 |
| 2021/0375194 | A1* | 12/2021 | Kwag | G09G 3/32 |
| 2022/0149255 | A1* | 5/2022 | Lee | H10H 20/857 |
| 2022/0158052 | A1* | 5/2022 | Lee | G09G 3/32 |
| 2022/0231002 | A1* | 7/2022 | Kim | G09G 3/32 |

FOREIGN PATENT DOCUMENTS

| | | |
|---|---|---|
| KR | 10-2017-0141305 | 12/2017 |
| KR | 10-2018-0009014 | 1/2018 |
| KR | 10-2018-0011404 | 2/2018 |

(Continued)

OTHER PUBLICATIONS

Korean Notice of Allowance for KR Application No. 10-2023-0013085, dated Jun. 11, 2026, 2 pages.

*Primary Examiner* — Dong Hui Liang
(74) *Attorney, Agent, or Firm* — Womble Bond Dickinson (US) LLP

(57) ABSTRACT

A display device where it is possible to prevent dark spots by aligning the light emitting elements through a primary alignment process followed by a secondary alignment process to evenly distribute the light emitting elements, and to secure overlapping connections and prevent a voltage drop by electrically connecting all alignment lines to high potential lines and low potential lines having a mesh structure after the alignment process is completed.

10 Claims, 19 Drawing Sheets

(56) References Cited

FOREIGN PATENT DOCUMENTS

| | | |
|---|---|---|
| KR | 10-2019-0099149 | 8/2019 |
| KR | 10-2021-0103602 | 8/2021 |
| KR | 10-2022-0067647 | 5/2022 |
| KR | 10-2022-0070127 | 5/2022 |
| KR | 10-2022-0094310 | 7/2022 |
| KR | 10-2022-0103602 A | 7/2022 |

* cited by examiner

DISPLAY DEVICE

CROSS-REFERENCE TO RELATED APPLICATIONS

This application claims priority under 35 U.S.C. § 119 from Korean Patent Application No. 10-2023-0013085 filed on Jan. 31, 2023 in the Korean Intellectual Property Office, the entire contents of which are incorporated herein by reference.

BACKGROUND

1. Technical Field

The disclosure relates to a display device.

2. Description of the Related Art

As the information society develops, the demand for display devices for displaying images has increased and diversified. For example, display devices have been applied to various electronic devices such as smartphones, digital cameras, laptop computers, navigation devices, and smart televisions. The display devices may be flat panel display devices such as liquid crystal display devices, field emission display devices, or organic light emitting display devices. Among such flat panel display devices, a light emitting display device may display an image without a backlight unit providing light to a display panel because each pixel of the display panel includes light emitting elements that may emit light by themselves. The light emitting element may be an organic light emitting diode that uses an organic material as a fluorescent material and an inorganic light emitting diode that uses an inorganic material as a fluorescent material.

SUMMARY

Aspects of the disclosure provides a display device capable of improving display quality by evenly distributing a plurality of light emitting elements to prevent dark spots and capable of securing overlapping connections and preventing an IR drop by electrically connecting all alignment lines to high potential lines or low potential lines having a mesh structure.

However, aspects of the disclosure may not be restricted to those set forth herein. The above and other aspects of the disclosure will become more apparent to one of ordinary skill in the art to which the disclosure pertains by referencing the detailed description of the disclosure given below.

According to an embodiment of the disclosure, a display device may include a first voltage line, first and second data lines, and a vertical voltage line disposed on a substrate and extending in parallel in a first direction, a horizontal voltage line, a second voltage line, and first and second horizontal connection lines disposed on the first voltage line and extending in parallel in a second direction intersecting the first direction, first to fourth alignment lines disposed on the horizontal voltage line and extending in parallel in the first direction, multiple first light emitting elements aligned between the first and second alignment lines, and multiple second light emitting elements aligned between the third and fourth alignment lines. The first voltage line, the horizontal voltage line, and the first alignment line may be electrically connected to each other. The first horizontal connection line and the second alignment line may be electrically connected to each other. The second horizontal connection line and the third alignment line may be electrically connected to each other. The vertical voltage line, the second voltage line, and the fourth alignment line may be electrically connected to each other.

The display device may further include a first upper voltage line disposed on the first to fourth alignment lines and extending in the first direction, and a second upper voltage line extending in the second direction, and the second upper voltage line and the first upper voltage line may be disposed on a same layer. The first and second upper voltage lines may be integral with each other.

The first and second upper voltage lines may be electrically connected to the second voltage line and the first and second horizontal connection lines.

The first upper voltage line may be electrically connected to the second voltage line through a first lower connection electrode disposed at a layer between the second voltage line and the vertical voltage line.

During an alignment of the first and second light emitting elements, the first horizontal connection line and the second alignment line may be electrically connected to the first data line and the second horizontal connection line and the third alignment line may be electrically connected to the second data line.

During a primary alignment of the first and second light emitting elements, the first and second alignment lines may receive a first alignment signal and the third and fourth alignment lines may receive a second alignment signal different from the first alignment signal.

During a secondary alignment of the first and second light emitting elements, the second and third alignment lines may receive the first alignment signal and the first and fourth alignment lines may receive the second alignment signal.

After an alignment of the first and second light emitting elements, the first horizontal connection line and the first data line may be electrically insulated from each other and the second horizontal connection line and the second data line may be electrically insulated from each other.

The display device may further include an initialization voltage line extending parallel to the first data line, the initialization voltage line and the first data line being disposed on a same layer, a first transistor electrically connected between the first voltage line and the first light emitting elements, a second transistor electrically connected between the first data line and a gate electrode of the first transistor, and a third transistor electrically connected between the initialization voltage line and the first light emitting elements.

The display device may further include a first contact electrode disposed on the first to fourth alignment lines and electrically connected between the first transistor and the first light emitting elements, a second contact electrode electrically connected between the first light emitting elements and the second light emitting elements, and a third contact electrode electrically connected between the second light emitting elements and the fourth alignment line.

According to an embodiment of the disclosure, a display device may include a first voltage line, a data line, and a vertical voltage line disposed on a substrate and extending in parallel in a first direction, a horizontal voltage line, a second voltage line, and a horizontal connection line disposed on the first voltage line and extending in parallel in a second direction intersecting the first direction, first to third alignment lines disposed on the horizontal voltage line and extending in parallel in the first direction, an alignment electrode surrounded by and spaced apart from the second alignment line, multiple first light emitting elements aligned between the first and second alignment lines, and multiple second light emitting elements aligned between the second and third alignment lines. The first voltage line, the horizontal voltage line, and the third alignment line may be electrically connected to each other. The horizontal connection line and the second alignment line may be electrically connected to each other. The vertical voltage line, the second voltage line, and the alignment electrode may be electrically connected to each other.

The display device may further include a plurality of pixels each including the first to third alignment lines. The third alignment line of one of the plurality of pixels, the first alignment line of another of the plurality of pixels adjacent to the one of the plurality of pixels in the second direction, and an alignment connection line may be integral with each other.

The display device may further include a first upper voltage line disposed on the first to third alignment lines and extending in the first direction, and a second upper voltage line extending in the second direction, and the second upper voltage line and the first upper voltage line may be disposed on a same layer. The first and second upper voltage lines may be integral with each other.

The first and second upper voltage lines may be electrically connected to the second voltage line and the horizontal connection line.

During an alignment of the first and second light emitting elements, the horizontal connection line and the second alignment line may be electrically connected to the data line.

During a primary alignment of the first and second light emitting elements, the alignment electrode may receive a first alignment signal and the first to third alignment lines may receive a second alignment signal different from the first alignment signal.

During a secondary alignment of the first and second light emitting elements, the second alignment line may receive the first alignment signal and the first and third alignment lines may receive the second alignment signal.

After an alignment of the first and second light emitting elements, the horizontal connection line and the data line may be electrically insulated from each other.

The display device may further include an initialization voltage line extending parallel to the data line, the initialization voltage line and the data line being disposed on a same layer, a first transistor electrically connected between the first voltage line and the first light emitting elements, a second transistor electrically connected between the data line and a gate electrode of the first transistor, and a third transistor electrically connected between the initialization voltage line and the first light emitting elements.

The display device may further include a first contact electrode disposed on the first to third alignment lines and electrically connected between the first transistor and the first light emitting elements, a second contact electrode electrically connected between the first light emitting elements and the second light emitting elements, and a third contact electrode electrically connected between the second light emitting elements and the second alignment line.

With a display device according to embodiments, it may be possible to prevent dark spots by aligning a plurality of light emitting elements through a primary alignment process and a secondary alignment process to evenly distribute the plurality of light emitting elements, and it may be possible to secure overlapping connections and prevent an IR drop by electrically connecting all alignment lines to high potential lines or low potential lines having a mesh structure.

The effects of the disclosure may not be limited to the aforementioned effects, and various other effects may be included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
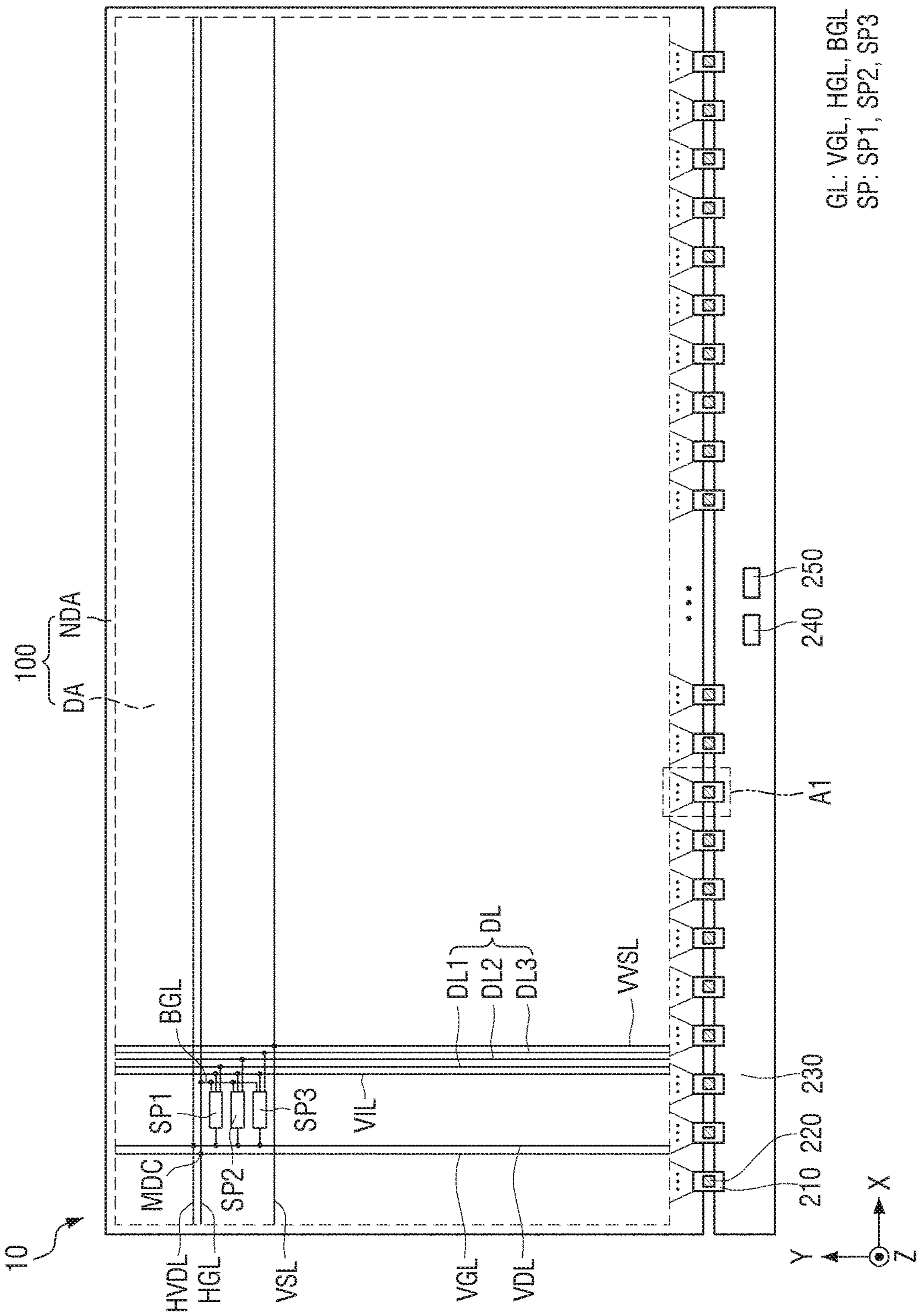
FIG. 1 is a plan view illustrating a display device according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in an embodiment.

Unless otherwise specified, the illustrated embodiments are to be understood as providing features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be predisposed differently from the described order. For example, two consecutively described processes may be predisposed substantially at a same time or predisposed in an order opposite to the described order. Also, like reference numerals and/or reference characters denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element. Further, the X-axis, the Y-axis, and the Z-axis may not be limited to three axes of a rectangular coordinate system, such as the x, y, and z axes, and may be interpreted in a broader sense. For example, the X-axis, the Y-axis, and the Z-axis may be perpendicular to one another, or may be different directions that may not be perpendicular to one another.

For the purposes of this disclosure, "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items. A description that a component is "configured to" perform a specified operation may be defined as a case where the component is constructed and arranged with structural features that can cause the component to perform the specified operation.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, may not be necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be disposed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, portion, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein. Hereinafter, detailed embodiments of the disclosure are described with reference to the accompanying drawings.

FIG. 1 is a plan view illustrating a display device according to an embodiment. The terms "above", "top", and "upper surface" as used herein refer to an upward direction (i.e., a Z-axis direction) with respect to the display device. The terms "below", "bottom", and "lower surface" as used herein refer to a downward direction (i.e., a direction opposite to the Z axis direction) with respect to the display device. The words "left", "right", "upper", and "lower" refer to directions when the display device may be viewed from above. For example, "left" refers to a direction opposite to an X-axis direction, "right" refers to the X-axis direction, "upper" refers to a Y-axis direction, and "lower" refers to a direction opposite to the Y-axis direction.

Referring to FIG. 1, a display device may be a device that displays a moving image or a still image, and may be used as a display screen of various products such as televisions, laptop computers, monitors, billboards, and Internet of Things (IOT) as well as portable electronic devices such as mobile phones, smartphones, tablet personal computers (PCs), smart watches, watch phones, mobile communication terminals, electronic organizers, electronic books, portable multimedia players (PMPs), navigation devices, and ultra mobile PCs (UMPCs).

The display device may include a display panel 100, flexible films 210, display drivers 220, a circuit board 230, a timing controller 240, and a power supply part 250. The display panel 100 may have a rectangular shape in plan view. For example, the display panel 100 may have a rectangular shape in plan view, having long sides in a first direction (X-axis direction) and short sides in a second direction (Y-axis direction). A corner where the long side in the first direction (X-axis direction) and the short side in the second direction (Y-axis direction) meet may be right-angled or may be rounded with a predetermined curvature. The shape of the display panel 100 in a plan view may not be limited to the rectangular shape, and may be other polygonal shapes, a circular shape, or an elliptical shape. As an example, the display panel 100 may be formed to be flat, but may not be limited thereto. As another example, the display panel 100 may be formed to be bent with a predetermined curvature.

The display panel 100 may include a display area DA and a non-display area NDA. The display area DA may be an area displaying an image, and may be defined as a central area of the display panel 100. The display area DA may include pixels SP, gate lines GL, data lines DL, initialization voltage lines VIL, first voltage lines VDL, horizontal voltage lines HVDL, vertical voltage lines VVSL, and second voltage lines VSL. The pixels SP may be formed in each of pixel areas crossed by the data lines DL and the gate lines GL. The pixel SP may include first to third pixels SP1, SP2, and SP3. Each of the first to third pixels SP1, SP2, and SP3 may be electrically connected to one horizontal gate line HGL and one data line DL. Each of the first to third pixels SP1, SP2, and SP3 may be defined as an area of a minimum unit emitting light.

The first pixel SP1 may emit light of a first color or red light, the second pixel SP2 may emit light of a second color or green light, and the third pixel SP3 may emit light of a third color or blue light. A pixel circuit of the first pixel SP1, a pixel circuit of the third pixel SP3, and a pixel circuit of the second pixel SP2 may be arranged in a direction opposite to the second direction (Y-axis direction), but the order of the pixel circuits may not be limited thereto.

The gate line GL may include vertical gate lines VGL, horizontal gate lines HGL, and auxiliary gate lines BGL. The vertical gate lines VGL may be electrically connected to the display drivers 220, may extend in the second direction (Y-axis direction), and may be spaced apart from each other in the first direction (X-axis direction). The vertical gate lines VGL may be disposed parallel to the data lines DL. The horizontal gate lines HGL may extend in the first direction (X-axis direction) and may be spaced apart from each other in the second direction (Y-axis direction). The horizontal gate lines HGL may cross the vertical gate lines VGL, respectively. For example, one horizontal gate line HGL may be electrically connected to one vertical gate line VGL of the vertical gate lines VGL through a contact part MDC. The contact part MDC may correspond to a portion where the horizontal gate line HGL may be inserted into a contact hole to come into contact with the vertical gate line VGL. The auxiliary gate lines BGL may extend from the horizontal gate lines HGL and supply gate signals to the first to third pixels SP1, SP2, and SP3.

The data lines DL may extend in the second direction (Y-axis direction) and may be spaced apart from each other in the first direction (X-axis direction). The data lines DL may include first to third data lines DL1, DL2, and DL3. Each of the first to third data lines DL1, DL2, and DL3 may supply a data voltage to each of the first to third pixels SP1, SP2, and SP3.

The initialization voltage lines VIL may extend in the second direction (Y-axis direction) and may be spaced apart from each other in the first direction (X-axis direction). The initialization voltage lines VIL may supply initialization voltages received from the display drivers 220 to the pixel circuit of each of the first to third pixels SP1, SP2, and SP3. The initialization voltage lines VIL may receive sensed signals from the pixel circuit of each of the first to third pixels SP1, SP2, and SP3 and supply the sensed signals to the display drivers 220.

The first voltage lines VDL may extend in the second direction (Y-axis direction) and may be spaced apart from each other in the first direction (X-axis direction). The first voltage lines VDL may supply a driving voltage or a high potential voltage received from the power supply part 250 to the first to third pixels SP1, SP2, and SP3.

The horizontal voltage lines HVDL may extend in the first direction (X-axis direction) and may be spaced apart from each other in the second direction (Y-axis direction). The horizontal voltage lines HVDL may be electrically connected to the first voltage lines VDL. The horizontal voltage lines HVDL may supply a driving voltage or a high potential voltage to the first voltage lines VDL.

The vertical voltage lines VVSL may extend in the second direction (Y-axis direction) and may be spaced apart from each other in the first direction (X-axis direction). The vertical voltage lines VVSL may be electrically connected to the second voltage lines VSL. The vertical voltage lines VVSL may supply a low potential voltage received from the power supply part 250 to the second voltage lines VSL.

The second voltage lines VSL may extend in the first direction (X-axis direction) and may be spaced apart from each other in the second direction (Y-axis direction). The second voltage lines VSL may supply the low potential voltage to the first to third pixels SP1, SP2, and SP3.

Connection relationships between the pixels SP, the gate lines GL, the data lines DL, the initialization voltage lines VIL, the first voltage lines VDL, and the second voltage lines VSL may be changed in design according to the number and an arrangement of pixels SP.

The non-display area NDA may be defined as an area other than the display area DA in the display panel 100. For example, the non-display area NDA may include fan-out lines connecting the vertical gate lines VGL, the data lines DL, the initialization voltage lines VIL, the first voltage lines VDL, and the vertical voltage lines VVSL to the display drivers 220 and pad parts (not illustrated) electrically connected to the flexible films 210.

Input terminals provided on one side of the flexible films 210 may be attached to the circuit board 230 by a film attaching process, and output terminals provided on the other sides of the flexible films 210 may be attached to the pad parts by a film attaching process. For example, the flexible film 210 may be a flexible film that may be bent, such as a tape carrier package or a chip on film. The flexible films 210 may be bent below the display panel 100 in order to decrease a bezel area of the display device.

The display driver 220 may be mounted on the flexible film 210. For example, the display driver 220 may be implemented as an integrated circuit (IC). The display drivers 220 may receive digital video data and data control signals from the timing controller 240, convert the digital video data into analog data voltages according to the data control signals, and supply the analog data voltages to the data lines DL through the fan-out lines. The display drivers 220 may generate gate signals according to gate control signals supplied from the timing controller 240 and sequentially supply the gate signals to the vertical gate lines VGL according to a set order. Accordingly, the display drivers 220 may simultaneously serve as data drivers and gate drivers. The display device 10 includes the display drivers 220 disposed on the lower side of the non-display area NDA, and thus, sizes of the left, right, and upper sides of the non-display area NDA may be minimized.

The circuit board 230 may support the timing controller 240 and the power supply part 250, and supply signals and power to the display drivers 220. For example, the circuit board 230 may supply signals supplied from the timing controller 240 and source voltages supplied from the power supply part 250 to the display drivers 220 in order to display an image in each pixel. To this end, signal lines and power lines may be provided on the circuit board 230.

The timing controller 240 may be mounted on the circuit board 230 and may receive image data and timing synchronization signals supplied from a display driving system or a graphic device through a user connector provided on the circuit board 230. The timing controller 240 may generate the digital video data by aligning the image data to be suitable for a pixel arrangement structure based on the timing synchronization signals, and may supply the generated digital video data to the display drivers 220. The timing controller 240 may generate data control signals and gate control signals based on the timing synchronization signals. The timing controller 240 may control a supply timing of data voltages of the display drivers 220 based on the data control signals, and may control a supply timing of the gate signals of the display drivers 220 based on the gate control signals.

The power supply part 250 may be disposed on the circuit board 230, and may supply source voltages to the display drivers 220 and the display panel 100. For example, the power supply part 250 may generate a driving voltage or a high potential voltage and supply the driving voltage or the high potential voltage to the first voltage lines VDL, may generate a low potential voltage and supply the low potential voltage to the vertical voltage lines VVSL, and may generate an initialization voltage and supply the initialization voltage to the initialization voltage lines VIL.

Figure 2:
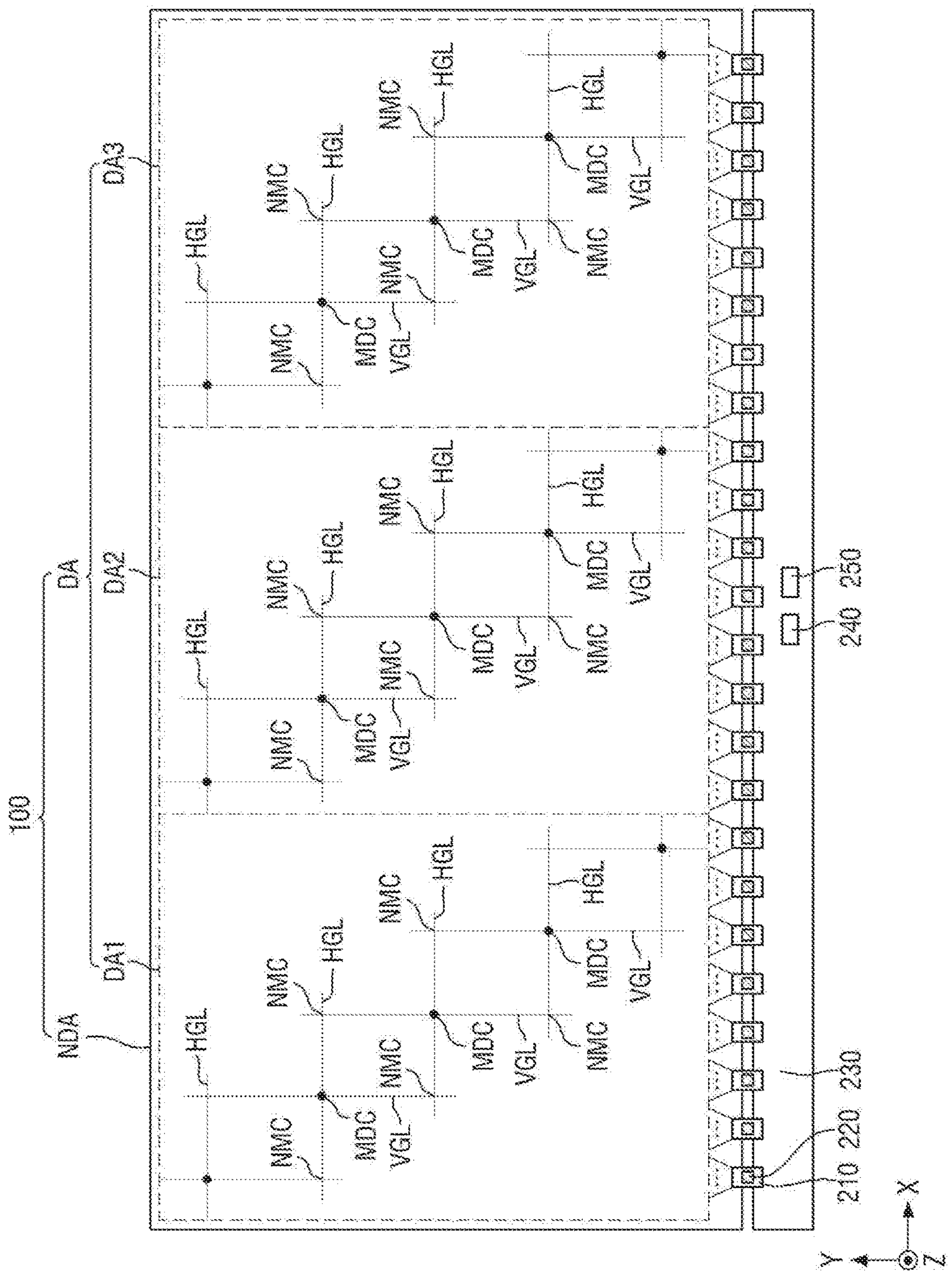
FIG. 2 is a plan view illustrating contact parts of vertical gate lines and horizontal gate lines in the display device according to an embodiment.

FIG. 2 is a plan view illustrating contact parts of vertical gate lines and horizontal gate lines in the display device according to an embodiment. Referring to FIG. 2, the display area DA may include first to third display areas DA1, DA2, and DA3.

The horizontal gate lines HGL may cross the vertical gate lines VGL, respectively. The horizontal gate lines HGL may cross the vertical gate lines VGL in contact parts MDC and non-contact parts NMC. For example, one horizontal gate line HGL may be electrically connected to one vertical gate line VGL of the vertical gate lines VGL through the contact part MDC. One horizontal gate line HGL may be insulated from the other vertical gate lines VGL at the non-contact parts NMC.

The contact parts MDC of the first display area DA1 may be disposed on an extension line connecting the upper left side of the first display area DA1 to the lower right side of the first display area DA1. The contact parts MDC of the second display area DA2 may be disposed on an extension line connecting the upper left side of the second display area DA2 to the lower right side of the second display area DA2. The contact parts MDC of the third display area DA3 may be disposed on an extension line connecting the upper left side of the third display area DA3 to the lower right side of the third display area DA3. Accordingly, the contact parts MDC may be arranged along a diagonal direction between the first direction (X-axis direction) and the direction opposite to the second direction (Y-axis direction) in each of the first to third display areas DA1, DA2, and DA3.

The display device 10 may include the display drivers 220 serving as data drivers and gate drivers. Accordingly, the data lines DL receive the data voltages from the display drivers 220 disposed on the lower side of the non-display area NDA and the vertical gate lines VGL receive the gate signals from the display drivers 220 disposed on the lower side of the non-display area NDA, and thus, sizes of the left side, the right side, and the upper side of the non-display area NDA of the display device 10 may be minimized.

Figure 3:
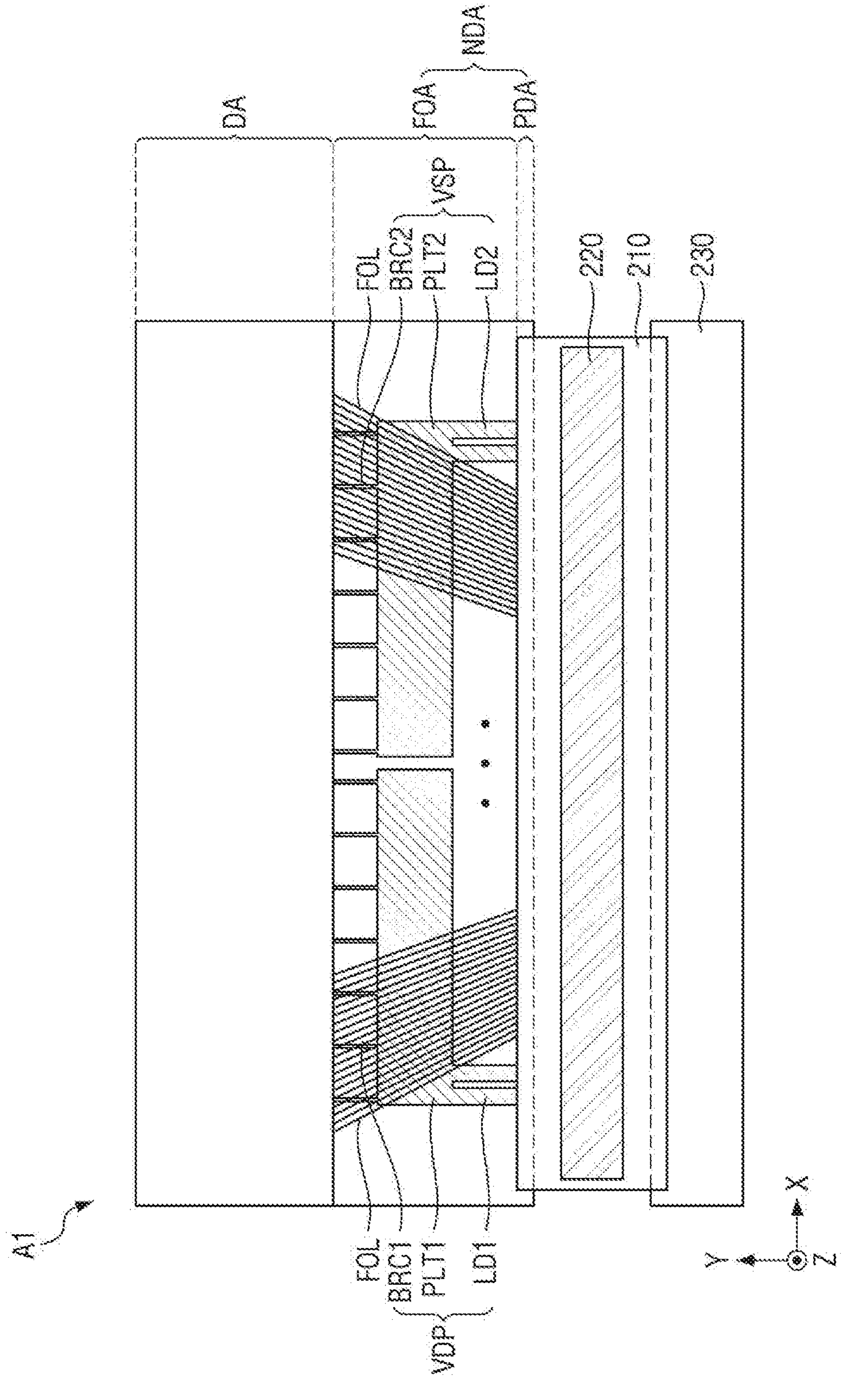
FIG. 3 is an enlarged view of area A1 of FIG. 1.

FIG. 3 is an enlarged view of area A1 of FIG. 1. Referring to FIG. 3, the non-display area NDA may include a pad area PDA and a fan-out area FOA. The pad area PDA and the fan-out area FOA may be disposed on one side of the non-display area NDA. The pad area PDA may include multiple pad parts electrically connected to the flexible films 210. The flexible films 210 may have the display drivers 220 mounted thereon and may be attached to the pad parts of the pad area PDA. The flexible films 210 may include signal lines electrically connecting the display drivers 220 and the pad parts.

The fan-out area FOA may be disposed between the pad area PDA and the display area DA. The fan-out area FOA may include multiple fan-out lines FOL. The fan-out lines FOL may electrically connect multiple data lines DL and the display drivers 220 to each other and electrically connect the initialization voltage lines VIL and the display drivers 220 to each other. The fan-out lines FOL may be disposed at a first metal layer on a substrate in the fan-out area FOA. For example, the fan-out lines FOL may be formed as a single layer or multiple layers made of molybdenum (Mo), aluminum (Al), chromium (Cr), gold (Au), titanium (Ti), nickel (Ni), neodymium (Nd), and copper (Cu), alloys thereof, or a combination thereof.

A first voltage pattern VDP may be disposed between the pad area PDA and the display area DA. The first voltage pattern VDP may be disposed on left fan-out lines FOL of the fan-out lines FOL in the fan-out area FOA. The first voltage pattern VDP may be disposed at a second metal layer on the first metal layer or at a third metal layer on the second metal layer, but may not be limited thereto. For example, the first voltage pattern VDP may be formed as a single layer or multiple layers made of molybdenum (Mo), aluminum (Al), chromium (Cr), gold (Au), titanium (Ti), nickel (Ni), neodymium (Nd), and copper (Cu), alloys thereof, or a combination thereof.

The first voltage pattern VDP may include a first lead part LD1, a first plate part PLT1, and first branch parts BRC1. The first lead part LD1 may extend from the pad area PDA to the first plate part PLT1. The first lead part LD1 may be connected to a lower left side of the first plate part PLT1.

The first plate part PLT1 may overlap the fan-out lines FOL and may have a plate shape having long sides and short sides. The first voltage pattern VDP includes the first plate part PLT1, and thus, internal resistance of the first voltage pattern VDP may be decreased and a size of the fan-out area FOA may be decreased. The first voltage pattern VDP includes the first plate part PLT1, and thus, signal interference due to coupling capacitance of the fan-out lines FOL may be decreased.

The first branch parts BRC1 may branch from the first plate part PLT1 and extend to the display area DA. The first branch parts BRC1 may extend in the second direction (Y-axis direction) and may be spaced apart from each other in the first direction (X-axis direction). The first branch parts BRC1 may be electrically connected to the first voltage lines VDL of the display area DA. Accordingly, the first voltage pattern VDP may supply the driving voltage or the high potential voltage received from the power supply part 250 to the first voltage lines VDL.

A second voltage pattern VSP may be disposed between the pad area PDA and the display area DA. The second voltage pattern VSP may be disposed on right fan-out lines FOL of the fan-out lines FOL in the fan-out area FOA. The first and second voltage patterns VDP and VSP may have symmetrical shapes, but may not be limited thereto. The second voltage pattern VSP may be formed of a same material as the first voltage pattern VDP on a same layer as the first voltage pattern VDP. Accordingly, the fan-out area FOA may include the fan-out lines FOL formed as two layers and the first and second voltage patterns VDP and VSP.

The second voltage pattern VSP may include a second lead part LD2, a second plate part PLT2, and second branch parts BRC2. The second lead part LD2 may extend from the pad area PDA to the second plate part PLT2. The second lead part LD2 may be electrically connected to a lower right side of the second plate part PLT2.

The second plate part PLT2 may overlap the fan-out lines FOL and may have a plate shape having long sides and short sides. The second voltage pattern VSP includes the second plate part PLT2, and thus, internal resistance of the second voltage pattern VSP may be decreased and a size of the fan-out area FOA may be decreased. The second voltage pattern VSP includes the second plate part PLT2, and thus, signal interference due to coupling capacitance of the fan-out lines FOL may be decreased.

The second branch parts BRC2 may branch from the second plate part PLT2 and extend to the display area DA. The second branch parts BRC2 may extend in the second direction (Y-axis direction) and may be spaced apart from each other in the first direction (X-axis direction). The second branch parts BRC2 may be electrically connected to the vertical voltage lines VVSL of the display area DA. Accordingly, the second voltage pattern VSP may supply the low potential voltage received from the power supply part 250 to the vertical voltage lines VVSL.

Figure 4:
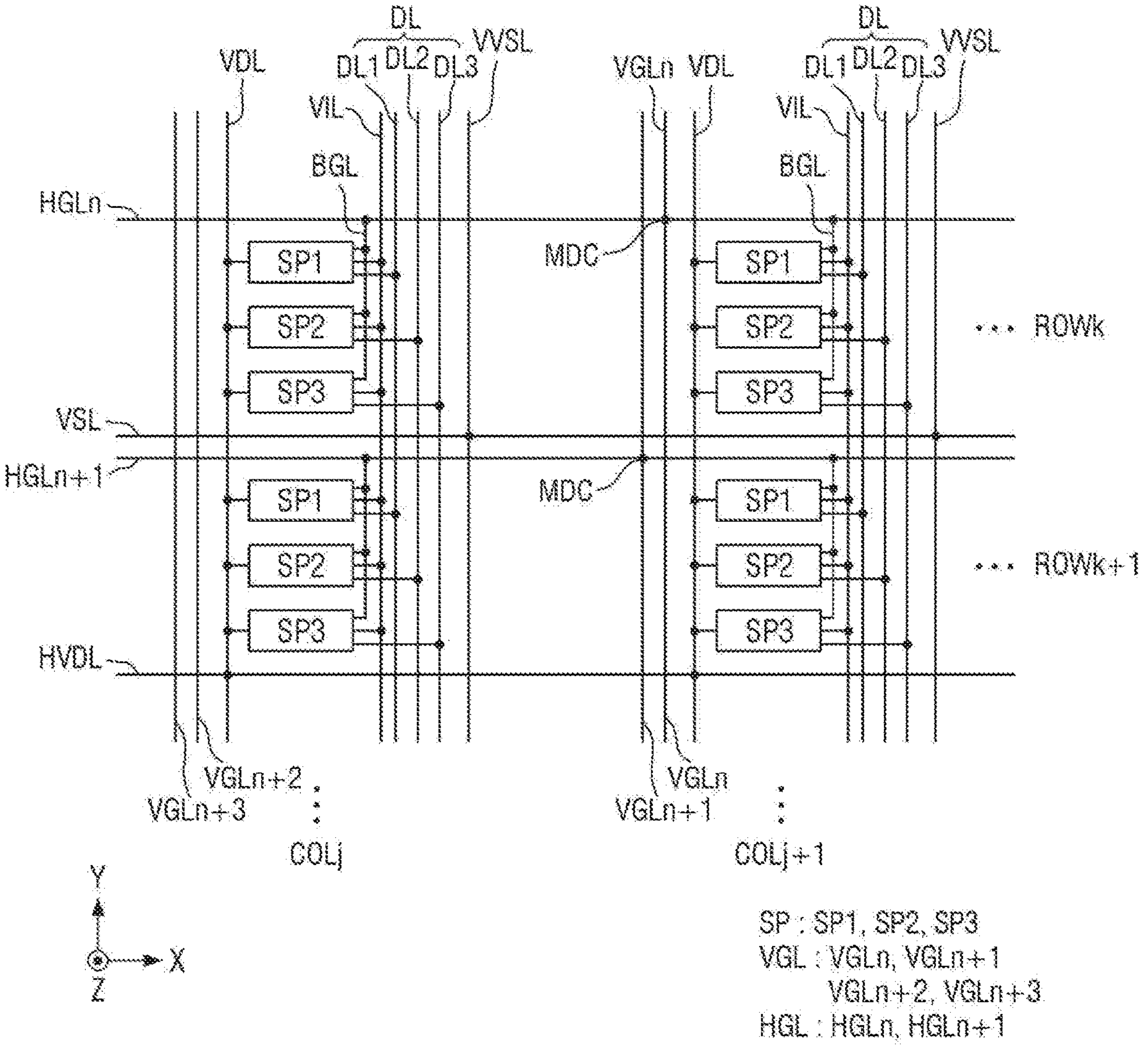
FIG. 4 is a view illustrating pixels and lines of the display device according to an embodiment.

FIG. 4 is a view illustrating pixels and lines of the display device according to an embodiment. Referring to FIG. 4, the pixel SP may include first to third pixels SP1, SP2, and SP3. A pixel circuit of the first pixel SP1, a pixel circuit of the second pixel SP2, and a pixel circuit of the third pixel SP3 may be arranged in the direction opposite to the second direction (Y-axis direction), but the order of the pixel circuits may not be limited thereto. Each of the first to third pixels SP1, SP2, and SP3 may be electrically connected to the first voltage line VDL, the initialization voltage line VIL, the gate line GL, and the data line DL.

The first voltage lines VDL may extend in the second direction (Y-axis direction). The first voltage line VDL may be disposed on the left side of the pixel circuits of the first to third pixels SP1, SP2, and SP3. The first voltage line VDL may supply the driving voltage or the high potential voltage to a transistor of each of the first to third pixels SP1, SP2, and SP3.

The horizontal voltage line HVDL may extend in the first direction (X-axis direction). The horizontal voltage line HVDL may be disposed on the lower side of a pixel circuit of a third pixel SP3 disposed in a k+1-th row ROWk+1 (here, k may be a positive integer). The horizontal voltage line HVDL or the second voltage line VSL may be disposed on the lower side of the pixel circuit of the third pixel SP3. The horizontal voltage lines HVDL may be electrically connected to the first voltage lines VDL. The horizontal voltage lines HVDL may receive the driving voltage or the high potential voltage from the first voltage lines VDL.

The initialization voltage lines VIL may extend in the second direction (Y-axis direction). The initialization voltage line VIL may be disposed on the right side of the auxiliary gate line BGL. The initialization voltage line VIL may be disposed between the auxiliary gate line BGL and the data line DL. The initialization voltage lines VIL may supply the initialization voltage to the pixel circuit of each of the first to third pixels SP1, SP2, and SP3. The initialization voltage lines VIL may receive sensed signals from the pixel circuit of each of the first to third pixels SP1, SP2, and SP3 and supply the sensed signals to the display drivers 220.

The gate line GL may include vertical gate lines VGL, horizontal gate lines HGL, and auxiliary gate lines BGL. The vertical gate lines VGL may extend in the second direction (Y-axis direction). At least one vertical gate line VGL may be disposed between adjacent pixels SP. The vertical gate line VGL may be electrically connected between the display driver 220 and the horizontal gate line HGL. The vertical gate lines VGL may cross the horizontal gate lines HGL, respectively. The vertical gate lines VGL may supply the gate signals received from the display drivers 220 to the horizontal gate lines HGL.

For example, an n-th vertical gate line VGLn (here, n may be a positive integer) and an n+1-th vertical gate line VGLn+1 may be disposed between pixels SP disposed in a j-th column COLj (here, j may be a positive integer) and pixels SP disposed in a j+1-th column COLj+1. The vertical gate lines VGL may be disposed parallel to and between the data line DL electrically connected to pixels SP disposed on the left side and the first voltage line VDL electrically connected to pixels SP disposed on the right side. The n-th and n+1-th vertical gate lines VGLn and VGLn+1 may be disposed between the data line DL electrically connected to the pixels SP disposed in the j-th column COLj and the first voltage line VDL electrically connected to the pixels SP disposed in the j+1-th column COLj+1. The n-th vertical gate line VGLn may be electrically connected to an n-th horizontal gate line HGLn through a contact part MDC, and may be insulated from the other horizontal gate lines HGL. The n+1-th vertical gate line VGLn_1 may be electrically connected to an n+1-th horizontal gate line HGLn+1 through a contact part MDC, and may be insulated from the other horizontal gate lines HGL.

At least one vertical gate line VGL may be disposed on the left side of the pixel SP. For example, an n+2-th vertical gate line VGLn+2 and an n+3-th vertical gate line VGLn+3 may be disposed on the left side of the pixels SP disposed in the j-th column COLj. The n+2-th and n+3-th vertical gate lines VGLn+2 and VGLn+3 may be disposed on the left side of the first voltage line VDL electrically connected to the pixels SP disposed in the j-th column COLj.

The horizontal gate lines HGL may extend in the first direction (X-axis direction). The horizontal gate line HGL may be disposed on the upper side of the pixel circuit of the first pixel SP1. The horizontal gate line HGL may be electrically connected between the vertical gate line VGL and the auxiliary gate line BGL. The horizontal gate line HGL may supply the gate signal received from the vertical gate line VGL to the auxiliary gate line BGL.

For example, the n-th horizontal gate line HGLn may be disposed on the upper side of a pixel circuit of a first pixel SP1 disposed in a k-th row ROWk (here, k may be a positive integer). The n-th horizontal gate line HGLn may be electrically connected to the n-th vertical gate line VGLn through the contact part MDC, and may be insulated from the other vertical gate lines VGL. The n+1-th horizontal gate line HGLn+1 may be disposed on the upper side of a pixel circuit of a first pixel SP1 disposed in a k+1-th row ROWk+1. The n+1-th horizontal gate line HGLn+1 may be electrically connected to the n+1-th vertical gate line VGLn+1 through the contact part MDC, and may be insulated from the other vertical gate lines VGL.

The auxiliary gate line BGL may extend in the direction opposite to the second direction (Y-axis direction) from the horizontal gate line HGL. The auxiliary gate line BGL may be disposed on the right side of the pixel circuits of the first to third pixels SP1, SP2, and SP3. The auxiliary gate line BGL may supply the gate signal received from the horizontal gate line HGL to the pixel circuits of the first to third pixels SP1, SP2, and SP3.

The data lines DL may extend in the second direction (Y-axis direction). The data lines DL may supply the data voltages to the pixels SP. The data lines DL may include first to third data lines DL1, DL2, and DL3. The first data line DL1 may extend in the second direction (Y-axis direction). The first data line DL1 may be disposed on the right side of the initialization voltage line VIL. The first data line DL1 may supply the data voltage received from the display driver 220 to the pixel circuit of the first pixel SP1. The second data line DL2 may extend in the second direction (Y-axis direction). The second data line DL2 may be disposed on the right side of the first data line DL1. The second data line DL2 may supply the data voltage received from the display driver 220 to the pixel circuit of the second pixel SP2. The third data line DL3 may extend in the second direction (Y-axis direction). The third data line DL3 may be disposed on the right side of the second data line DL2. The third data line DL3 may supply the data voltage received from the display driver 220 to the pixel circuit of the third pixel SP3.

The vertical voltage line VVSL may extend in the second direction (Y-axis direction). The vertical voltage line VVSL may be disposed on the right side of the third data line DL3. The vertical voltage line VVSL may be electrically connected between the power supply part 250 and the second voltage line VSL. The vertical voltage line VVSL may supply the low potential voltage supplied from the power supply part 250 to the second voltage line VSL.

The second voltage lines VSL may extend in the first direction (X-axis direction). The second voltage line VSL may be disposed on the lower side of a pixel circuit of a third pixel SP3 disposed in the k-th row ROWk. The second voltage line VSL may be electrically connected to the vertical voltage line VVSL. The second voltage line VSL may supply the low potential voltage received from the vertical voltage line VVSL to light emitting element layers of the first to third pixels SP1, SP2, and SP3.

Figure 5:
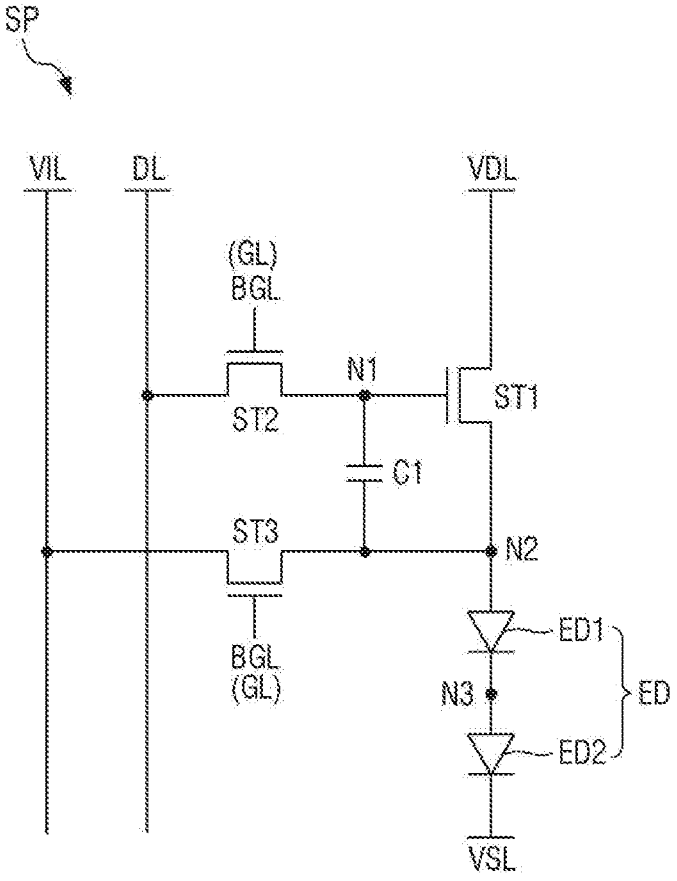
FIG. 5 is a schematic diagram of an equivalent circuit of a pixel of the display device according to an embodiment.

FIG. 5 is a schematic diagram of an equivalent circuit of a pixel of the display device according to an embodiment. Referring to FIG. 5, each of the pixels SP may be electrically connected to the first voltage line VDL, the data line DL, the initialization voltage line VIL, the auxiliary gate line BGL, and the second voltage line VSL. Each of first to third pixels SP1, SP2, and SP3 may include first to third transistors ST1, ST2, and ST3, a first capacitor C1, and multiple light emitting elements ED.

The first transistor ST1 may include a gate electrode, a drain electrode, and a source electrode. The gate electrode of the first transistor ST1 may be electrically connected to a first node N1, the drain electrode of the first transistor ST1 may be electrically connected to the first voltage line VDL, and the source electrode of the first transistor ST1 may be electrically connected to a second node N2. The first transistor ST1 may control a drain-source current (or a driving current) based on a data voltage applied to the gate electrode.

The light emitting elements ED may include a first light emitting element ED1 and a second light emitting element ED2. The first and second light emitting elements ED1 and ED2 may be electrically connected to each other in series. The first and second light emitting elements ED1 and ED2 may receive the driving current to emit light. A light emission amount or luminance of the light emitting element ED may be proportional to a magnitude of the driving current. The light emitting element ED may be an inorganic light emitting element including an inorganic semiconductor, but may not be limited thereto.

A first electrode of the first light emitting element ED1 may be electrically connected to the second node N2, and a second electrode of the first light emitting element ED1 may be electrically connected to a third node N3. The first electrode of the first light emitting element ED1 may be electrically connected to the source electrode of the first transistor ST1, a drain electrode of the third transistor ST3, and a second capacitor electrode of the first capacitor C1 through the second node N2. The second electrode of the first light emitting element ED1 may be electrically connected to a first electrode of the second light emitting element ED2 through the third node N3.

The first electrode of the second light emitting element ED2 may be electrically connected to the third node N3, and a second electrode of the second light emitting element ED2 may be electrically connected to the second voltage line VSL. The first electrode of the second light emitting element ED2 may be electrically connected to the second electrode of the first light emitting element ED1 through the third node N3.

The second transistor ST2 may be turned on by a gate signal of the auxiliary gate line BGL or the gate line GL to electrically connect the data line DL and the first node N1, which may be the gate electrode of the first transistor ST1, to each other. The second transistor ST2 may be turned on based on the gate signal to supply a data voltage to the first node N1. A gate electrode of the second transistor ST2 may be electrically connected to the auxiliary gate line BGL, a drain electrode of the second transistor ST2 may be electrically connected to the data line DL, and a source electrode of the second transistor ST2 may be electrically connected to the first node N1. The source electrode of the second transistor ST2 may be electrically connected to the gate electrode of the first transistor ST1 and a first capacitor electrode of the first capacitor C1 through the first node N1.

The third transistor ST3 may be turned on by a gate signal of the auxiliary gate line BGL or the gate line GL to electrically connect the initialization voltage line VIL and the second node N2 to each other, where the second node N2 may be the source electrode of the first transistor ST1. The third transistor ST3 may be turned on based on the gate signal to supply an initialization voltage to the second node N2. A gate electrode of the third transistor ST3 may be electrically connected to the auxiliary gate line BGL, the drain electrode of the third transistor ST3 may be electrically connected to the second node N2, and a source electrode of the third transistor ST3 may be electrically connected to the initialization voltage line VIL. The drain electrode of the third transistor ST3 may be electrically connected to the source electrode of the first transistor ST1, the second capacitor electrode of the first capacitor C1, and the first electrode of the first light emitting element ED1 through the second node N2.

Figure 6:
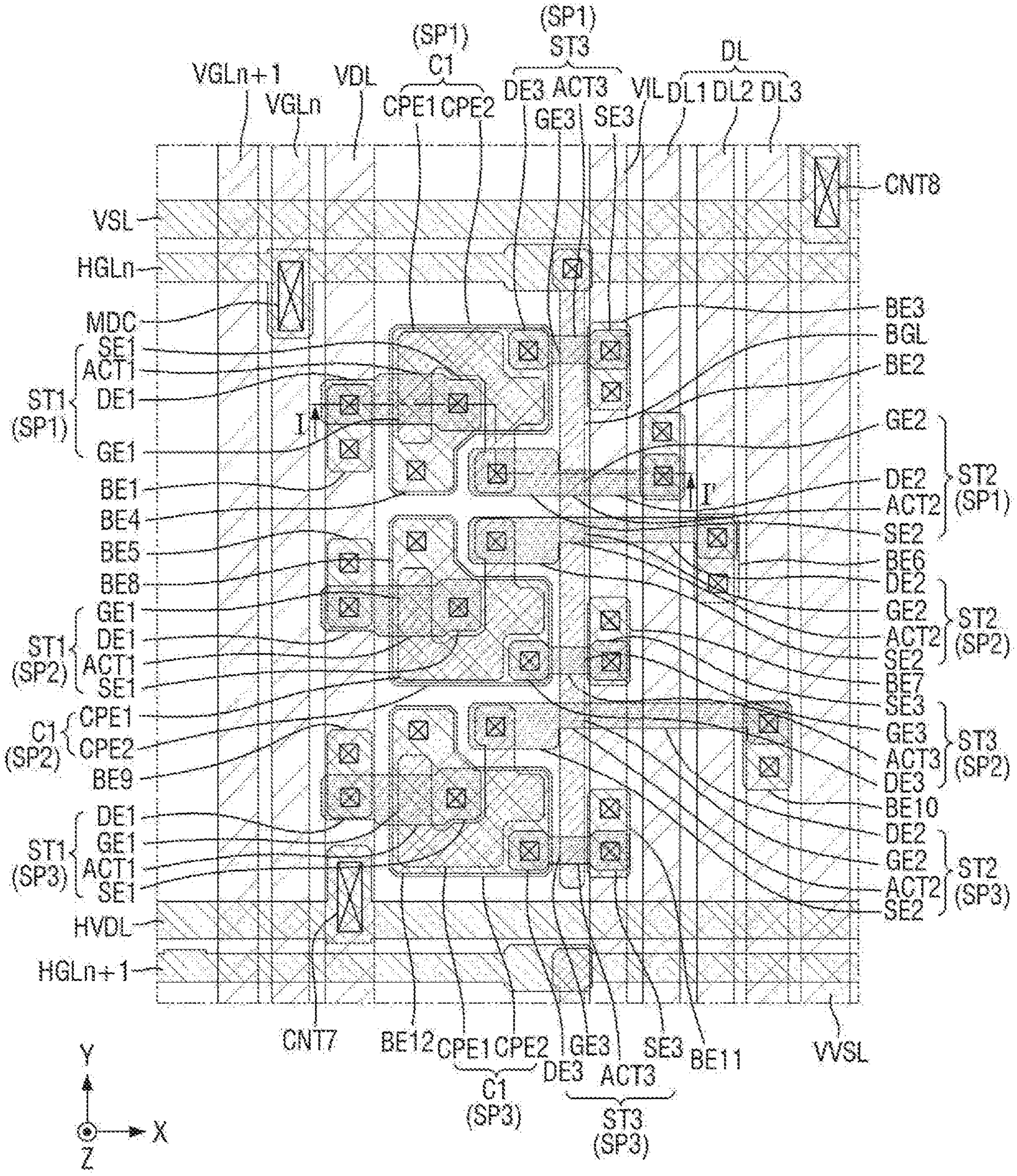
FIGS. 6 and 7 are plan views illustrating a thin film transistor layer of the display device according to an embodiment.
Figure 7:
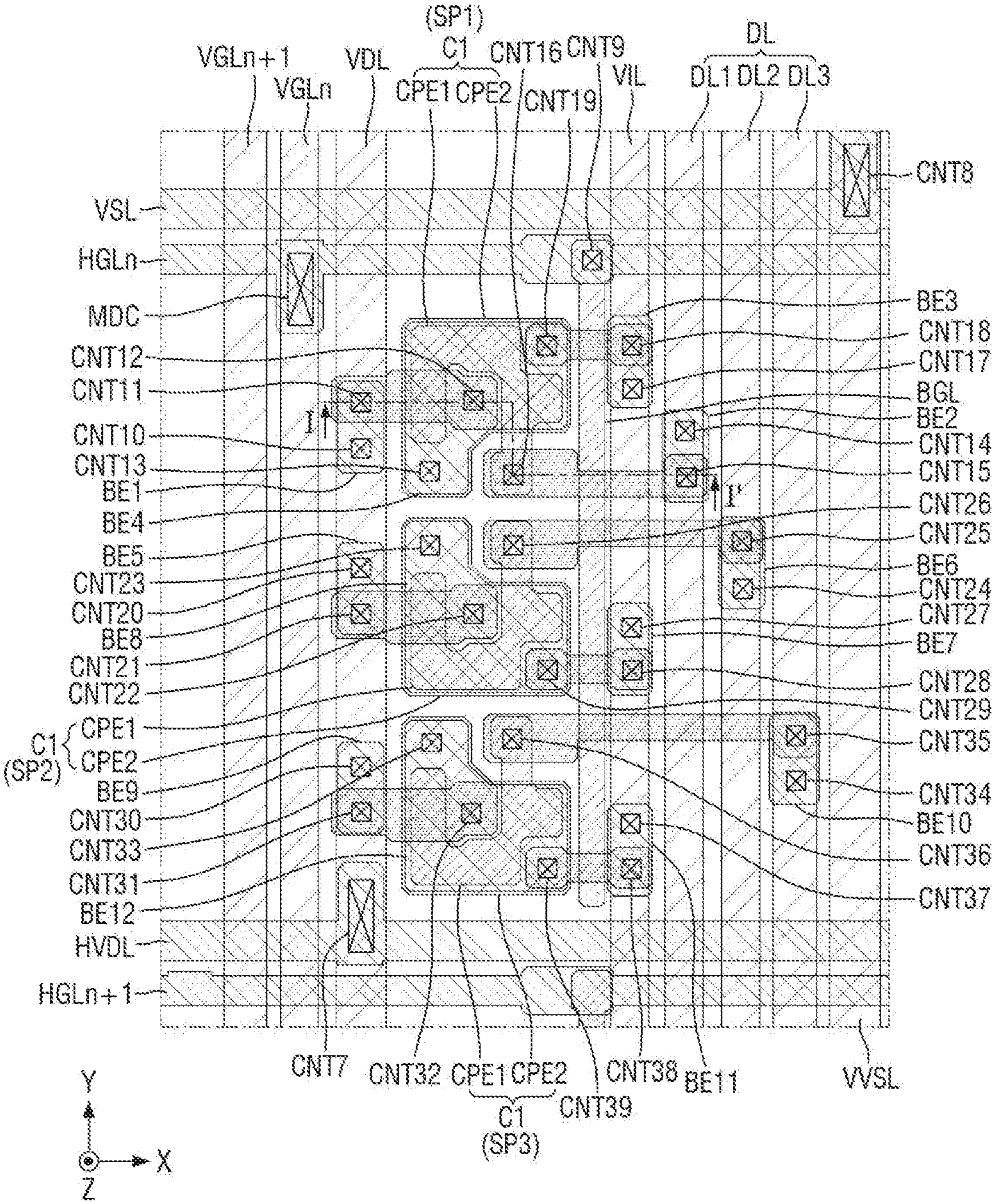
Figure 8:
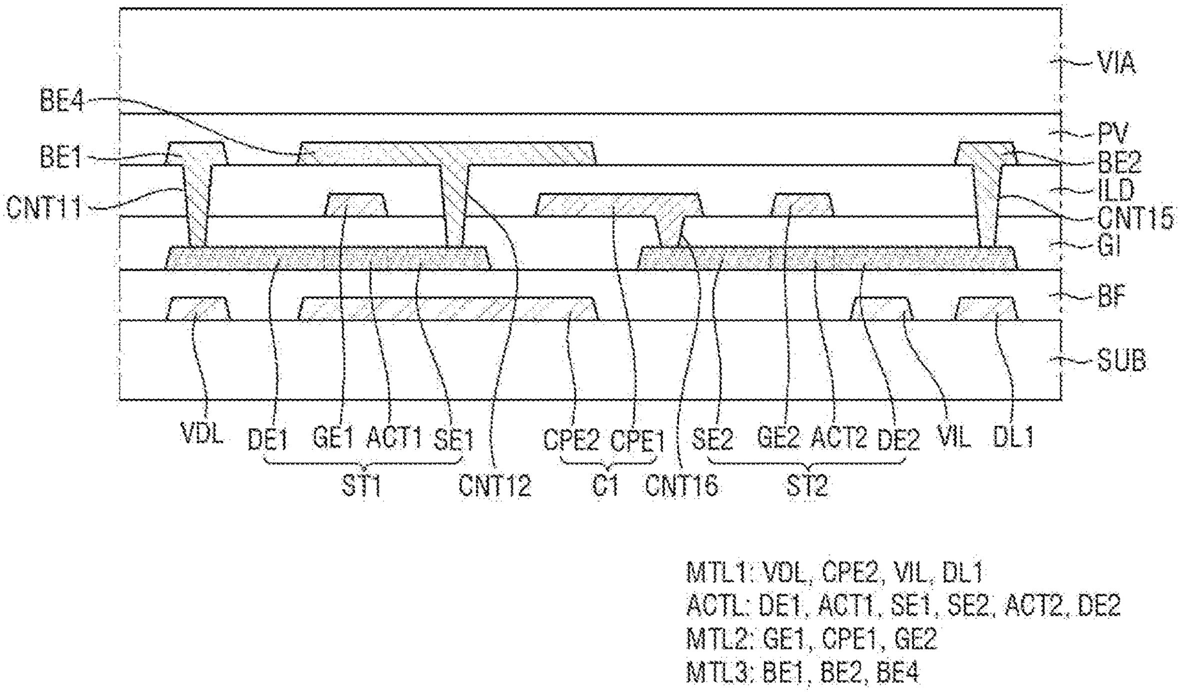
FIG. 8 is a schematic cross-sectional view taken along line I-I' of FIGS. 6 and 7.

FIGS. 6 and 7 are plan views illustrating a thin film transistor layer of the display device according to an embodiment, and FIG. 8 is a schematic cross-sectional view taken along line I-I' of FIGS. 6 and 7. FIGS. 6 and 7 are the same drawing in which reference numerals may be separately denoted.

Referring to FIGS. 6 to 8, the display area DA may include a pixel SP, a first voltage line VDL, a horizontal voltage line HVDL, a vertical gate line VGL, a horizontal gate line HGL, an auxiliary gate line BGL, an initialization voltage line VIL, a data line DL, a vertical voltage line VVSL, and a second voltage line VSL. The pixel SP may include first to third pixels SP1, SP2, and SP3. A pixel circuit of the first pixel SP1, a pixel circuit of the second pixel SP2, and a pixel circuit of the third pixel SP3 may be arranged in the direction opposite to the second direction (Y-axis direction).

The first voltage line VDL may be disposed at a first metal layer MTL1 on a substrate SUB. The first voltage line VDL may be disposed on the left side of the pixel circuits of the first to third pixels SP1, SP2, and SP3. The first voltage line VDL may be electrically connected to a first connection electrode BE1 of a third metal layer MTL3 through a tenth contact hole CNT10, and the first connection electrode BE1 may be electrically connected to a drain electrode DE1 of a first transistor ST1 of the first pixel SP1 through an eleventh contact hole CNT11. The first voltage line VDL may be electrically connected to a fifth connection electrode BE5 of the third metal layer MTL3 through a twentieth contact hole CNT20, and the fifth connection electrode BE5 may be electrically connected to a drain electrode DE1 of a first transistor ST1 of the second pixel SP2 through a twenty-first contact hole CNT21. The first voltage line VDL may be electrically connected to a ninth connection electrode BE9 of the third metal layer MTL3 through a thirtieth contact hole CNT30, and the ninth connection electrode BE9 may be electrically connected to a drain electrode DE1 of a first transistor ST1 of the third pixel SP3 through a thirty-first contact hole CNT31.

The horizontal voltage line HVDL may be disposed at the third metal layer MTL3. The third metal layer MTL3 may be disposed on an interlayer insulating layer ILD covering a second metal layer MTL2. The horizontal voltage line HVDL may be disposed on the lower side of the pixel circuit of the third pixel SP3. The horizontal voltage line HVDL may be disposed on the upper side of an n+1-th horizontal gate line HGLn+1. The horizontal voltage line HVDL may be electrically connected to multiple first voltage lines VDL through a seventh contact hole CNT7 to receive a driving voltage. The horizontal voltage line HVDL may stably maintain the driving voltage or a high potential voltage of the first voltage lines VDL.

The vertical gate line VGL may be disposed at the first metal layer MTL1. The vertical gate line VGL may include an n-th vertical gate line VGLn and an n+1-th vertical gate line VGLn+1 disposed on the left side of the first voltage line VDL. The n-th vertical gate line VGLn may be electrically connected to an n-th horizontal gate line HGLn through a contact part MDC, and may be insulated from the other horizontal gate lines HGL.

The horizontal gate line HGL may be disposed at the third metal layer MTL3. The horizontal gate line HGL may be disposed on the upper side of the pixel circuit of the first pixel SP1. The n-th horizontal gate line HGLn may be electrically connected to the n-th vertical gate line VGLn through the contact part MDC. The n-th horizontal gate line HGLn may be electrically connected to the auxiliary gate line BGL through a ninth first contact hole CNT9. The n-th horizontal gate line HGLn may supply a gate signal received from the n-th vertical gate line VGLn to the auxiliary gate line BGL.

The auxiliary gate line BGL may be disposed at the second metal layer MTL2. The second metal layer MTL2 may be disposed on a gate insulating layer GI covering an active layer ACTL. The auxiliary gate line BGL may extend in the direction opposite to the second direction (Y-axis direction) from the horizontal gate line HGL. The auxiliary gate line BGL may be disposed on the right side of the pixel circuits of the first to third pixels SP1, SP2, and SP3. The auxiliary gate lines BGL may supply the gate signal received from the horizontal gate line HGL to the first to third pixels SP1, SP2, and SP3.

The initialization voltage line VIL may be disposed at the first metal layer MTL1. The initialization voltage line VIL may be disposed on the right side of the auxiliary gate line BGL. The initialization voltage line VIL may be electrically connected to a third connection electrode BE3 of the third metal layer MTL3 through a seventeenth contact hole CNT17, and the third connection electrode BE3 may be electrically connected to a source electrode SE3 of a third transistor ST3 of the first pixel SP1 through an eighteenth contact hole CNT18. The initialization voltage line VIL may be electrically connected to a seventh connection electrode BE7 of the third metal layer MTL3 through a twenty-seventh contact hole CNT27, and the seventh connection electrode BE7 may be electrically connected to a source electrode SE3 of a third transistor ST3 of the second pixel SP2 through a twenty-eighth contact hole CNT28. The initialization voltage line VIL may be electrically connected to an eleventh connection electrode BE11 of the third metal layer MTL3 through a thirty-seventh contact hole CNT37, and the eleventh connection electrode BE11 may be electrically connected to a source electrode SE3 of a third transistor ST3 of the third pixel SP3 through a thirty-eighth contact hole CNT38. Accordingly, the initialization voltage line VIL may supply the initialization voltage to the third transistor ST3 of each of the first to third pixels SP1, SP2, and SP3 and receive the sensed signal from the third transistor ST3.

The first data line DL1 may be disposed at the first metal layer MTL1. The first data line DL1 may be disposed on the right side of the initialization voltage line VIL. The first data line DL1 may be electrically connected to a second connection electrode BE2 of the third metal layer MTL3 through a fourteenth contact hole CNT14, and the second connection electrode BE2 may be electrically connected to a drain electrode DE2 of a second transistor ST2 of the first pixel SP1 through a fifteenth contact hole CNT15. The first data line DL1 may supply the data voltage to the second transistor ST2 of the first pixel SP1.

The second data line DL2 may be disposed at the first metal layer MTL1. The second data line DL2 may be disposed on the right side of the first data line DL1. The second data line DL2 may be electrically connected to a sixth connection electrode BE6 of the third metal layer MTL3 through a twenty-fourth contact hole CNT24, and the sixth connection electrode BE6 may be electrically connected to a drain electrode DE2 of a second transistor ST2 of the second pixel SP2 through a twenty-fifth contact hole CNT25. The second data line DL2 may supply the data voltage to the second transistor ST2 of the second pixel SP2.

The third data line DL3 may be disposed at the first metal layer MTL1. The third data line DL3 may be disposed on the right side of the second data line DL2. The third data line DL3 may be electrically connected to a tenth connection electrode BE10 of the third metal layer MTL3 through a thirty-fourth contact hole CNT34, and the tenth connection electrode BE10 may be electrically connected to a drain electrode DE2 of a second transistor ST2 of the third pixel SP3 through a thirty-fifth contact hole CNT35. The third data line DL3 may supply the data voltage to the second transistor ST2 of the third pixel SP3.

The vertical voltage line VVSL may be disposed at the first metal layer MTL1. The vertical voltage line VVSL may be disposed on the right side of the third data line DL3. The vertical voltage line VVSL may be electrically connected to the second voltage line VSL of the third metal layer MTL3 through an eighth contact hole CNT8. The vertical voltage line VVSL may supply the low potential voltage to the second voltage line VSL.

The second voltage line VSL may be disposed at the third metal layer MTL3. The second voltage line VSL may be disposed on the upper side of the n-th horizontal gate line HGLn. The second voltage line VSL may supply the low potential voltage received from the vertical voltage line VVSL to a fourth alignment line AL4 (see FIG. 12) of each of the first to third pixels SP1, SP2, and SP3. Here, the fourth alignment line of each of the first to third pixels SP1, SP2, and SP3 may be disposed at a fourth metal layer MTL4 (see FIG. 14) on the third metal layer MTL3.

The pixel circuit of the first pixel SP1 may include the first to third transistors ST1, ST2, and ST3. The first transistor ST1 of the first pixel SP1 may include an active region ACT1, a gate electrode GE1, the drain electrode DE1, and a source electrode SE1. The active region ACT1 of the first transistor ST1 may be disposed at the active layer ACTL, and may overlap the gate electrode GE1 of the first transistor ST1. The active layer ACTL may be disposed on the buffer layer BF covering the first metal layer MTL1. The gate electrode GE1 of the first transistor ST1 may be disposed at the second metal layer MTL2. The gate electrode GE1 of the first transistor ST1 may be a portion of a first capacitor electrode CPE1 of a first capacitor C1. The first capacitor electrode CPE1 may be electrically connected to a source electrode SE2 of the second transistor ST2 of the active layer ACTL through a sixteenth contact hole CNT16.

The drain electrode DE1 and the source electrode SE1 of the first transistor ST1 may become conductors by heat-treating the active layer ACTL. The drain electrode DE1 of the first transistor ST1 may be electrically connected to the first voltage line VDL through the first connection electrode BE1. The drain electrode DE1 of the first transistor ST1 may receive the driving voltage from the first voltage line VDL.

The source electrode SE1 of the first transistor ST1 may be electrically connected to a fourth connection electrode BE4 of the third metal layer MTL3 through a twelfth contact hole CNT12. The fourth connection electrode BE4 may be electrically connected to a second capacitor electrode CPE2 of the first metal layer MTL1 through a thirteenth contact hole CNT13. Accordingly, the first capacitor C1 may be doubly formed between the first capacitor electrode CPE1 and the second capacitor electrode CPE2 and between the first capacitor electrode CPE1 and the fourth connection electrode BE4.

The fourth connection electrode BE4 may be electrically connected to a drain electrode DE3 of the third transistor ST3 through a nineteenth contact hole CNT19. The fourth connection electrode BE4 may be electrically connected to a first contact electrode CTE1 (see FIG. 13) of the first pixel SP1. Here, the first contact electrode CTE1 (see FIG. 13) of the first pixel SP1 may be disposed at a fifth metal layer MTL5 (see FIG. 14).

The second transistor ST2 of the first pixel SP1 may include an active region ACT2, a gate electrode GE2, the drain electrode DE2, and the source electrode SE2. The active region ACT2 of the second transistor ST2 may be disposed at the active layer ACTL, and may overlap the gate electrode GE2 of the second transistor ST2. The gate electrode GE2 of the second transistor ST2 may be disposed at the second metal layer MTL2. The gate electrode GE2 of the second transistor ST2 may be a portion of the auxiliary gate line BGL.

The drain electrode DE2 and the source electrode SE2 of the second transistor ST2 may become conductors by heat-treating the active layer ACTL. The drain electrode DE2 of the second transistor ST2 may be electrically connected to the first data line DL1 through the second connection electrode BE2. The drain electrode DE2 of the second transistor ST2 may receive the data voltage of the first pixel SP1 from the first data line DL1.

The source electrode SE2 of the second transistor ST2 may be electrically connected to the first capacitor electrode CPE1 through the sixteenth contact hole CNT16 to be electrically connected to the gate electrode GE1 of the first transistor ST1.

The third transistor ST3 of the first pixel SP1 may include an active region ACT3, a gate electrode GE3, the drain electrode DE3, and the source electrode SE3. The active region ACT3 of the third transistor ST3 may be disposed at the active layer ACTL, and may overlap the gate electrode GE3 of the third transistor ST3. The gate electrode GE3 of the third transistor ST3 may be disposed at the second metal layer MTL2. The gate electrode GE3 of the third transistor ST3 may be a portion of the auxiliary gate line BGL.

The drain electrode DE3 and the source electrode SE3 of the third transistor ST3 may become conductors by heat-treating the active layer ACTL. The drain electrode DE3 of the third transistor ST3 may be electrically connected to the fourth connection electrode BE4 through the nineteenth contact hole CNT19. The fourth connection electrode BE4 may be electrically connected to the source electrode SE1 of the first transistor ST1 through the twelfth contact hole CNT12, and may be electrically connected to the second capacitor electrode CPE2 of the first metal layer MTL1 through the thirteenth contact hole CNT13.

The source electrode SE3 of the third transistor ST3 may be electrically connected to the initialization voltage line VIL through the third connection electrode BE3. The source electrode SE3 of the third transistor ST3 may receive the initialization voltage from the initialization voltage line VIL. The source electrode SE3 of the third transistor ST3 may supply the sensed signal to the initialization voltage line VIL.

The pixel circuit of the second pixel SP2 may include the first to third transistors ST1, ST2, and ST3. The first transistor ST1 of the second pixel SP2 may include an active region ACT1, a gate electrode GE1, the drain electrode DE1, and a source electrode SE1. The active region ACT1 of the first transistor ST1 may be disposed at the active layer ACTL, and may overlap the gate electrode GE1 of the first transistor ST1. The gate electrode GE1 of the first transistor ST1 may be disposed at the second metal layer MTL2. The gate electrode GE1 of the first transistor ST1 may be a portion of a first capacitor electrode CPE1 of a first capacitor C1. The first capacitor electrode CPE1 may be electrically connected to a source electrode SE2 of the second transistor ST2 of the active layer ACTL through a twenty-sixth contact hole CNT26.

The drain electrode DE1 and the source electrode SE1 of the first transistor ST1 may become conductors by heat-treating the active layer. The drain electrode DE1 of the first transistor ST1 may be electrically connected to the first voltage line VDL through the fifth connection electrode BE5. The drain electrode DE1 of the first transistor ST1 may receive the driving voltage from the first voltage line VDL.

The source electrode SE1 of the first transistor ST1 may be electrically connected to an eighth connection electrode BE8 of the third metal layer MTL3 through a twenty-second contact hole CNT22. The eighth connection electrode BE8 may be electrically connected to a second capacitor electrode CPE2 of the first metal layer MTL1 through a twenty-third contact hole CNT23. Accordingly, the first capacitor C1 may be doubly formed between the first capacitor electrode CPE1 and the second capacitor electrode CPE2 and between the first capacitor electrode CPE1 and the eighth connection electrode BE8.

The eighth connection electrode BE8 may be electrically connected to a drain electrode DE3 of the third transistor ST3 through a twenty-ninth contact hole CNT29. The eighth connection electrode BE8 may be electrically connected to a first contact electrode of the second pixel SP2. Here, the first contact electrode of the second pixel SP2 may be disposed at the fifth metal layer MTL5 (see FIG. 14).

The second transistor ST2 of the second pixel SP2 may include an active region ACT2, a gate electrode GE2, the drain electrode DE2, and the source electrode SE2. The active region ACT2 of the second transistor ST2 may be disposed at the active layer ACTL, and may overlap the gate electrode GE2 of the second transistor ST2. The gate electrode GE2 of the second transistor ST2 may be disposed at the second metal layer MTL2. The gate electrode GE2 of the second transistor ST2 may be a portion of the auxiliary gate line BGL.

The drain electrode DE2 and the source electrode SE2 of the second transistor ST2 may become conductors by heat-treating the active layer ACTL. The drain electrode DE2 of the second transistor ST2 may be electrically connected to the second data line DL2 through the sixth connection electrode BE6. The drain electrode DE2 of the second transistor ST2 may receive the data voltage of the second pixel SP2 from the second data line DL2.

The source electrode SE2 of the second transistor ST2 may be electrically connected to the first capacitor electrode CPE1 through the twenty-sixth contact hole CNT26 to be electrically connected to the gate electrode GE1 of the first transistor ST1.

The third transistor ST3 of the second pixel SP2 may include an active region ACT3, a gate electrode GE3, the drain electrode DE3, and the source electrode SE3. The active region ACT3 of the third transistor ST3 may be disposed at the active layer ACTL, and may overlap the gate electrode GE3 of the third transistor ST3. The gate electrode GE3 of the third transistor ST3 may be disposed at the second metal layer MTL2. The gate electrode GE3 of the third transistor ST3 may be a portion of the auxiliary gate line BGL.

The drain electrode DE3 and the source electrode SE3 of the third transistor ST3 may become conductors by heat-treating the active layer ACTL. The drain electrode DE3 of the third transistor ST3 may be electrically connected to the eighth connection electrode BE8 through the twenty-ninth contact hole CNT29. The eighth connection electrode BE8 may be electrically connected to the source electrode SE1 of the first transistor ST1 through the twenty-second contact hole CNT22, and may be electrically connected to the second capacitor electrode CPE2 of the first metal layer MTL1 through the twenty-third contact hole CNT23.

The source electrode SE3 of the third transistor ST3 may be electrically connected to the initialization voltage line VIL through the seventh connection electrode BE7. The source electrode SE3 of the third transistor ST3 may receive the initialization voltage from the initialization voltage line VIL. The source electrode SE3 of the third transistor ST3 may supply the sensed signal to the initialization voltage line VIL.

The pixel circuit of the third pixel SP3 may include the first to third transistors ST1, ST2, and ST3. The first transistor ST1 of the third pixel SP3 may include an active region ACT1, a gate electrode GE1, the drain electrode DE1, and a source electrode SE1. The active region ACT1 of the first transistor ST1 may be disposed at the active layer ACTL, and may overlap the gate electrode GE1 of the first transistor ST1. The gate electrode GE1 of the first transistor ST1 may be disposed at the second metal layer MTL2. The gate electrode GE1 of the first transistor ST1 may be a portion of a first capacitor electrode CPE1 of a first capacitor C1. The first capacitor electrode CPE1 may be electrically connected to a source electrode SE2 of the second transistor ST2 of the active layer ACTL through a thirty-sixth contact hole CNT36.

The drain electrode DE1 and the source electrode SE1 of the first transistor ST1 may become conductors by heat-treating the active layer. The drain electrode DE1 of the first transistor ST1 may be electrically connected to the first voltage line VDL through the ninth connection electrode BE9. The drain electrode DE1 of the first transistor ST1 may receive the driving voltage from the first voltage line VDL.

The source electrode SE1 of the first transistor ST1 may be electrically connected to a twelfth connection electrode BE12 of the third metal layer MTL3 through a thirty-second contact hole CNT32. The twelfth connection electrode BE12 may be electrically connected to a second capacitor electrode CPE2 of the first metal layer MTL1 through a thirty-third contact hole CNT33. Accordingly, the first capacitor C1 may be doubly formed between the first capacitor electrode CPE1 and the second capacitor electrode CPE2 and between the first capacitor electrode CPE1 and the twelfth connection electrode BE12.

The twelfth connection electrode BE12 may be electrically connected to a drain electrode DE3 of the third transistor ST3 through a thirty-ninth contact hole CNT39. The twelfth connection electrode BE12 may be electrically connected to a first contact electrode of the third pixel SP3. Here, the first contact electrode of the third pixel SP3 may be disposed at the fifth metal layer MTL5 (see FIG. 14).

The second transistor ST2 of the third pixel SP2 may include an active region ACT2, a gate electrode GE2, the drain electrode DE2, and the source electrode SE2. The active region ACT2 of the second transistor ST2 may be disposed at the active layer ACTL, and may overlap the gate electrode GE2 of the second transistor ST2. The gate electrode GE2 of the second transistor ST2 may be disposed at the second metal layer MTL2. The gate electrode GE2 of the second transistor ST2 may be a portion of the auxiliary gate line BGL.

The drain electrode DE2 and the source electrode SE2 of the second transistor ST2 may become conductors by heat-treating the active layer ACTL. The drain electrode DE2 of the second transistor ST2 may be electrically connected to the third data line DL3 through the tenth connection electrode BE10. The drain electrode DE2 of the second transistor ST2 may receive the data voltage of the third pixel SP3 from the third data line DL3.

The source electrode SE2 of the second transistor ST2 may be electrically connected to the first capacitor electrode CPE1 through the thirty-sixth contact hole CNT36 to be electrically connected to the gate electrode GE1 of the first transistor ST1.

The third transistor ST3 of the third pixel SP3 may include an active region ACT3, a gate electrode GE3, the drain electrode DE3, and the source electrode SE3. The active region ACT3 of the third transistor ST3 may be disposed at the active layer ACTL, and may overlap the gate electrode GE3 of the third transistor ST3. The gate electrode GE3 of the third transistor ST3 may be disposed at the second metal layer MTL2. The gate electrode GE3 of the third transistor ST3 may be a portion of the auxiliary gate line BGL.

The drain electrode DE3 and the source electrode SE3 of the third transistor ST3 may become conductors by heat-treating the active layer ACTL. The drain electrode DE3 of the third transistor ST3 may be electrically connected to the twelfth connection electrode BE12 through the thirty-ninth contact hole CNT39. The twelfth connection electrode BE12 may be electrically connected to the source electrode SE1 of the first transistor ST1 through the thirty-second contact hole CNT32, and may be electrically connected to the second capacitor electrode CPE2 of the first metal layer MTL1 through the thirty-third contact hole CNT33.

The source electrode SE3 of the third transistor ST3 may be electrically connected to the initialization voltage line VIL through the eleventh connection electrode BE11. The source electrode SE3 of the third transistor ST3 may receive the initialization voltage from the initialization voltage line VIL. The source electrode SE3 of the third transistor ST3 may supply the sensed signal to the initialization voltage line VIL.

In FIG. 8, a passivation layer PV may be disposed on the third metal layer MTL3 and the interlayer insulating layer ILD to protect the pixel circuits of the first to third pixels SP1, SP2, and SP3. A via layer VIA may be disposed on the passivation layer PV to planarize an upper end of the thin film transistor layer.

Figure 9:
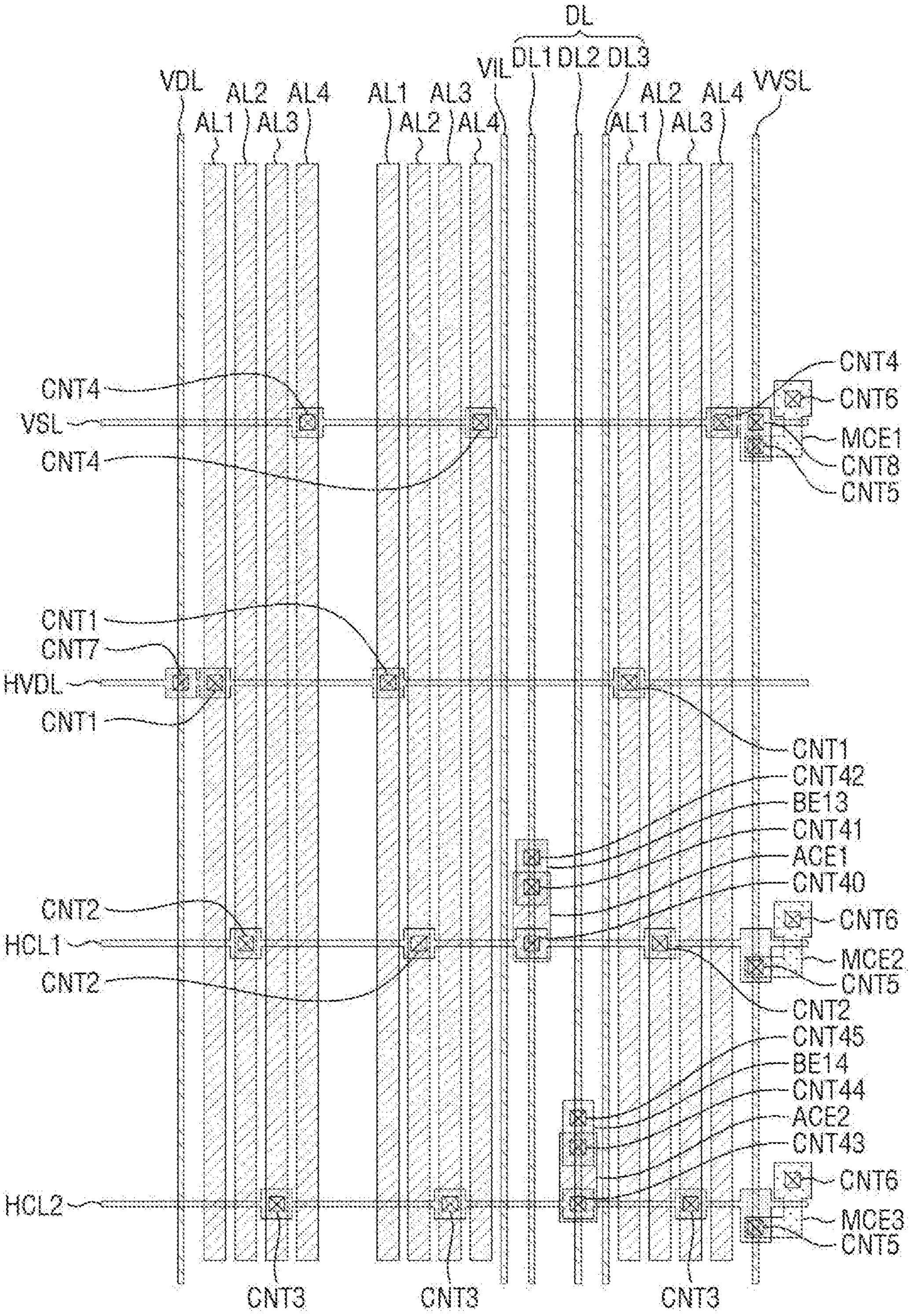
FIG. 9 is a plan view illustrating a connection relationship between alignment lines and the thin film transistor layer before alignment of light emitting elements in the display device according to an embodiment.
Figure 10:
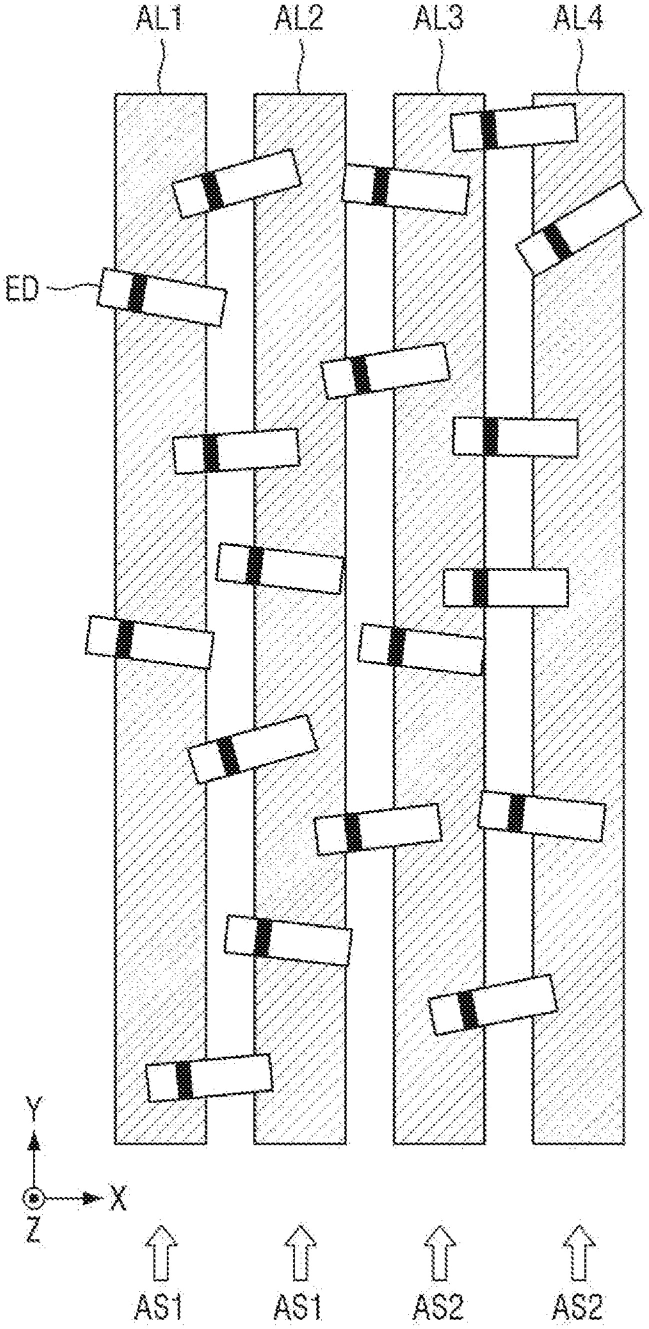
FIG. 10 is a view illustrating a primary alignment process of multiple light emitting elements in the display device according to an embodiment.

FIG. 9 is a plan view illustrating a connection relationship between alignment lines and the thin film transistor layer before alignment of light emitting elements in the display device according to an embodiment. FIG. 10 is a view illustrating a primary alignment process of multiple light emitting elements in the display device according to an embodiment, and FIG. 11 is a view illustrating a secondary alignment process of the light emitting elements in the display device according to an embodiment.

Figure 11:
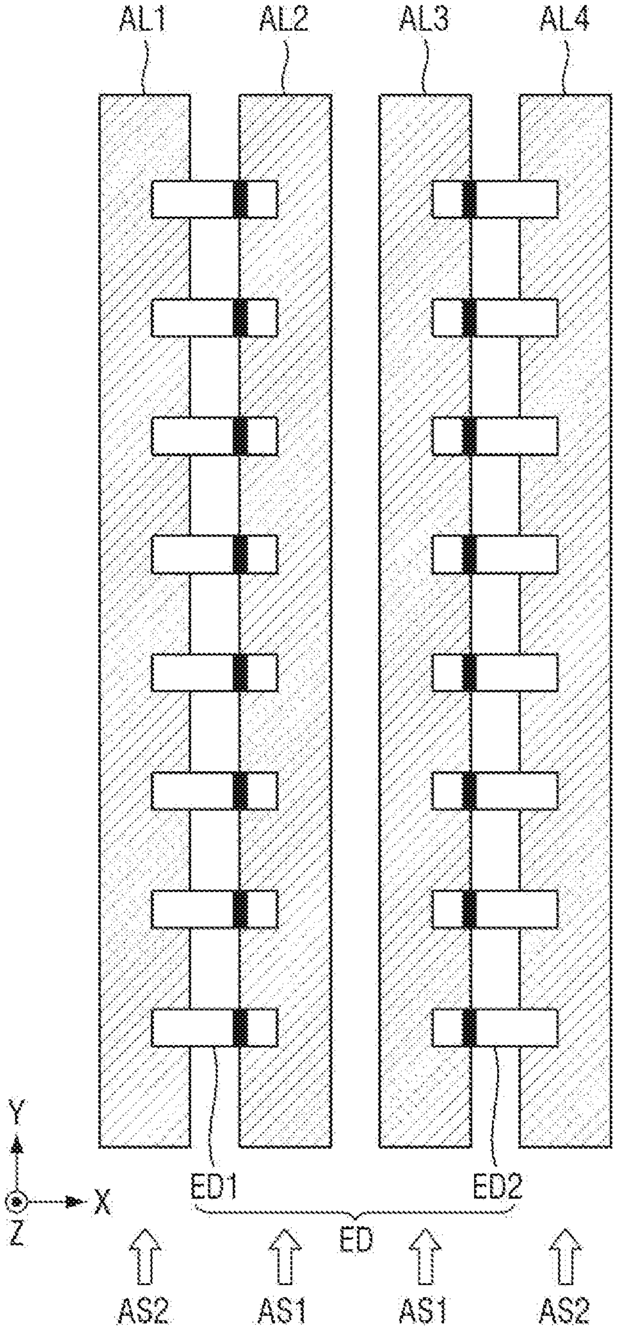
FIG. 11 is a view illustrating a secondary alignment process of the light emitting elements in the display device according to an embodiment.

Referring to FIGS. 9 to 11, each of the first to third pixels SP1, SP2, and SP3 may include an alignment line AL. The alignment lines AL of the first to third pixels SP1, SP2, and SP3 may be spaced apart from each other in the first direction (X-axis direction). The alignment line AL may include first to fourth alignment lines AL1, AL2, AL3, and AL4. The first to fourth alignment lines AL1, AL2, AL3, and AL4 may extend in the second direction (Y-axis direction) and may be spaced apart from each other in the first direction (X-axis direction). The first to fourth alignment lines AL1, AL2, AL3, and AL4 may be disposed at the fourth metal layer MTL4 (see FIG. 14). In FIG. 9, the alignment lines AL of the first to third pixels SP1, SP2, and SP3 may not overlap the first voltage line VDL, the initialization voltage line VIL, the first to third data lines DL1, DL2, and DL3, and the vertical voltage line VVSL, but may not be limited thereto. As another example, at least one of the first to fourth alignment lines AL1, AL2, AL3, and AL4 of the first to third pixels SP1, SP2, and SP3 may overlap at least one of the first voltage line VDL, the initialization voltage line VIL, the first to third data lines DL1, DL2, and DL3, and the vertical voltage line VVSL.

The fourth alignment line AL4 of each of the first to third pixels SP1, SP2, and SP3 may be electrically connected to the second voltage line VSL of the third metal layer MTL3 through a fourth contact hole CNT4. The second voltage line VSL may be electrically connected to the vertical voltage line VVSL of the first metal layer MTL1 through the eighth contact hole CNT8 and may be electrically connected to a first lower connection electrode MCE1 of the second metal layer MTL2 through a fifth contact hole CNT5. Accordingly, the fourth alignment line AL4 may receive an alignment signal through the vertical voltage line VVSL.

The first alignment line AL1 of each of the first to third pixels SP1, SP2, and SP3 may be electrically connected to the horizontal voltage line HVDL of the third metal layer MTL3 through a first contact hole CNT1. The horizontal voltage line HVDL may be electrically connected to the first voltage line VDL of the first metal layer MTL1 through the seventh contact hole CNT7. Accordingly, the first alignment line AL1 may receive an alignment signal through the first voltage line VDL.

The second alignment line AL2 of each of the first to third pixels SP1, SP2, and SP3 may be electrically connected to a first horizontal connection line HCL1 of the third metal layer MTL3 through a second contact hole CNT2. The first horizontal connection line HCL1 may be electrically connected to a first upper connection electrode ACE1 of the fourth metal layer MTL4 (see FIG. 14) through a fortieth contact hole CNT40 and may be electrically connected to a second lower connection electrode MCE2 of the second metal layer MTL2 through a fifth contact hole CNT5. The first upper connection electrode ACE1 may be electrically connected to a thirteenth connection electrode BE13 of the third metal layer MTL3 through a forty-first contact hole CNT41, and the thirteenth connection electrode BE13 may be electrically connected to the first data line DL1 of the first metal layer MTL1 through a forty-second contact hole CNT42. Accordingly, the second alignment line AL2 may receive an alignment signal through the first data line DL1. As another example, the second alignment line AL2 may be electrically connected to the initialization voltage line VIL or the third data line DL3 to receive an alignment signal.

The third alignment line AL3 of each of the first to third pixels SP1, SP2, and SP3 may be electrically connected to a second horizontal connection line HCL2 of the third metal layer MTL3 through a third contact hole CNT3. The second horizontal connection line HCL2 may be electrically connected to a second upper connection electrode ACE2 of the fourth metal layer MTL4 (see FIG. 14) through a forty-third contact hole CNT43 and may be electrically connected to a third lower connection electrode MCE3 of the second metal layer MTL2 through a fifth contact hole CNT5. The second upper connection electrode ACE2 may be electrically connected to a fourteenth connection electrode BE14 of the third metal layer MTL3 through a forty-fourth contact hole CNT44, and the fourteenth connection electrode BE14 may be electrically connected to the second data line DL2 of the first metal layer MTL1 through a forty-fifth contact hole CNT45. Accordingly, the third alignment line AL3 may receive an alignment signal through the second data line DL2. As another example, the third alignment line AL3 may be electrically connected to the initialization voltage line VIL or the third data line DL3 to receive an alignment signal.

In FIG. 10, the first and second alignment lines AL1 and AL2 of each of the first to third pixels SP1, SP2, and SP3 may receive a first alignment signal AS1, and the third and fourth alignment lines AL3 and AL4 of each of the first to third pixels SP1, SP2, and SP3 may receive a second alignment signal AS2. For example, the first alignment signal AS1 may be an alternating current (AC) signal having a frequency (e.g., predetermined or selectable frequency), and the second alignment signal AS2 may be a ground signal, but the disclosure may not be limited thereto. The first and second alignment lines AL1 and AL2 receive the first alignment signal AS1 and the third and fourth alignment lines AL3 and AL4 receive the second alignment signal AS2, such that an electric field may be formed from the first and second alignment lines AL1 and AL2 toward the third and fourth alignment lines AL3 and AL4. For example, multiple light emitting elements ED may be jetted onto the alignment lines AL of the first to third pixels SP1, SP2, and SP3 through an inkjet printing process, and the light emitting elements ED dispersed in ink may be aligned by receiving a dielectrophoresis force by an electric field. Accordingly, the light emitting elements ED may be aligned toward the same direction on the first to fourth alignment lines AL1, AL2, AL3, and AL4.

In FIG. 11, the second and third alignment lines AL2 and AL3 of each of the first to third pixels SP1, SP2, and SP3 may receive the first alignment signal AS1, and the first and fourth alignment lines AL1 and AL4 of each of the first to third pixels SP1, SP2, and SP3 may receive the second alignment signal AS2. The second alignment line AL2 receives the first alignment signal AS1 and the first alignment line AL1 receives the second alignment signal AS2, such that an electric field may be formed from the second alignment line AL2 to the first alignment line AL1. Accordingly, multiple first light emitting elements ED1 may be aligned toward the first direction (X-axis direction) between the first and second alignment lines AL1 and AL2. The third alignment line AL3 receives the first alignment signal AS1 and the fourth alignment line AL4 receives the second alignment signal AS2, such that an electric field may be formed from the third alignment line AL3 to the fourth alignment line AL4. Accordingly, multiple second light emitting elements ED2 may be aligned toward a direction opposite to the first direction (X-axis direction) between the third and fourth alignment lines AL3 and AL4.

In the display device 10, by aligning the light emitting elements ED through the primary alignment process of FIG. 10 and the secondary alignment process of FIG. 11 to prevent the light emitting elements ED from being partially concentrated, the light emitting elements ED may be evenly distributed. Accordingly, the display device 10 may improve display quality by preventing dark spots.

Figure 12:
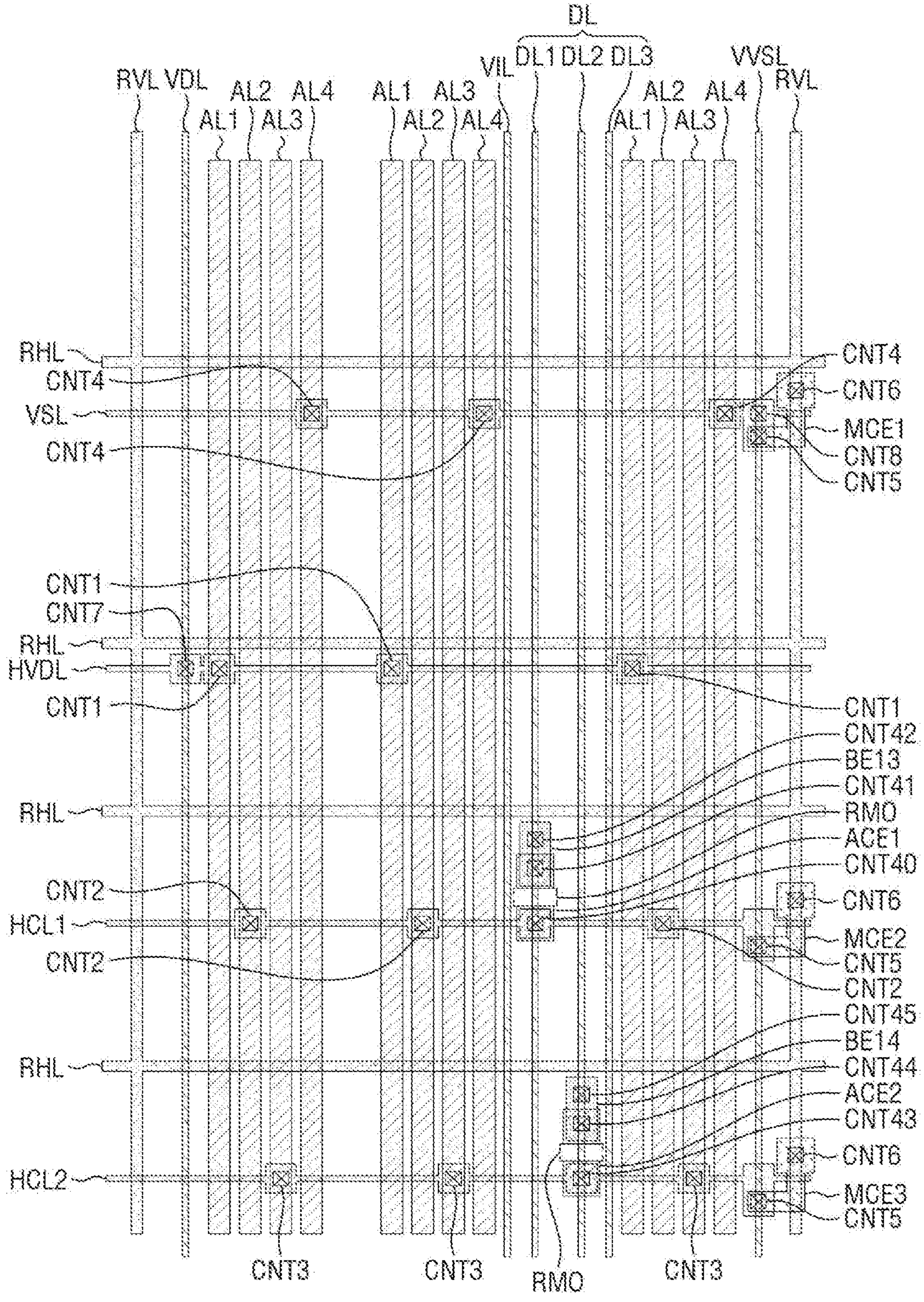
FIG. 12 is a plan view illustrating a connection relationship between the alignment lines and the thin film transistor layer after the alignment of the light emitting elements in the display device according to an embodiment.

FIG. 12 is a plan view illustrating a connection relationship between the alignment lines and the thin film transistor layer after the alignment of the light emitting elements in the display device according to an embodiment. Referring to FIG. 12, first and second upper voltage lines RVL and RHL may be disposed at the fifth metal layer MTL5 (see FIG. 14) on the fourth metal layer MTL4 (see FIG. 14). The fifth metal layer MTL5 (see FIG. 14) may be formed after the light emitting elements ED may be aligned.

Multiple first upper voltage lines RVL may extend in the second direction (Y-axis direction) and may be spaced apart from each other in the first direction (X-axis direction). The first upper voltage line RVL may be electrically connected to the first lower connection electrode MCE1 of the second metal layer MTL2 through a sixth contact hole CNT6. The first lower connection electrode MCE1 may be electrically connected to the second voltage line VSL of the third metal layer MTL3 through the fifth contact hole CNT5. The second voltage line VSL may be electrically connected to the vertical voltage line VVSL of the first metal layer MTL1 through the eighth contact hole CNT8. Accordingly, the first upper voltage line RVL may receive the low potential voltage from the vertical voltage line VVSL.

The first upper voltage line RVL may be electrically connected to the second lower connection electrode MCE2 of the second metal layer MTL2 through a sixth contact hole CNT6. The second lower connection electrode MCE2 may be electrically connected to the first horizontal connection line HCL1 of the third metal layer MTL3 through the fifth contact hole CNT5. The first upper connection electrode ACE1 may be cut by a separator part RMO. Accordingly, the first horizontal connection line HCL1 may be electrically insulated from the first data line DL1 and may receive the low potential voltage from the first upper voltage line RVL.

The first upper voltage line RVL may be electrically connected to the third lower connection electrode MCE3 of the second metal layer MTL2 through a sixth contact hole CNT6. The third lower connection electrode MCE3 may be electrically connected to the second horizontal connection line HCL2 of the third metal layer MTL3 through the fifth contact hole CNT5. The second upper connection electrode ACE2 may be cut by a separator part RMO. Accordingly, the second horizontal connection line HCL2 may be electrically insulated from the second data line DL2 and may receive the low potential voltage from the first upper voltage line RVL.

Multiple second upper voltage lines RHL may extend in the first direction (X-axis direction) and may be spaced apart from each other in the second direction (Y-axis direction). The second upper voltage lines RHL may be integral with the first upper voltage lines RVL. Accordingly, the second upper voltage line RHL may receive the low potential voltage from the vertical voltage line VVSL. The second upper voltage lines RHL may cross the first to fourth alignment lines AL1, AL2, AL3, and AL4.

The first alignment line AL1 of the display device 10 may be electrically connected to the horizontal voltage line HVDL and the first voltage line VDL to receive the high potential voltage, and the second to fourth alignment lines AL2, AL3, and AL4 of the display device 10 may be electrically connected to the vertical voltage line VVSL, the second voltage line VSL, the first and second horizontal connection lines HCL1 and HCL2, and the first and second upper voltage lines RVL and RHL to receive the low potential voltage. The first alignment line AL1 may be electrically connected to high potential lines (e.g., the horizontal voltage line HVDL and the first voltage line VDL) having a mesh structure, and the second to fourth alignment lines AL2, AL3, and AL4 may be electrically connected to low potential lines (e.g., the vertical voltage line VVSL and the second voltage line VSL or the first and second upper voltage lines RVL and RHL) having a mesh structure. Accordingly, all of the alignment lines AL of the display device 10 may be electrically connected to the high potential lines or the low potential lines having the mesh structure to secure overlapping connections and prevent an IR drop.

Figure 13:
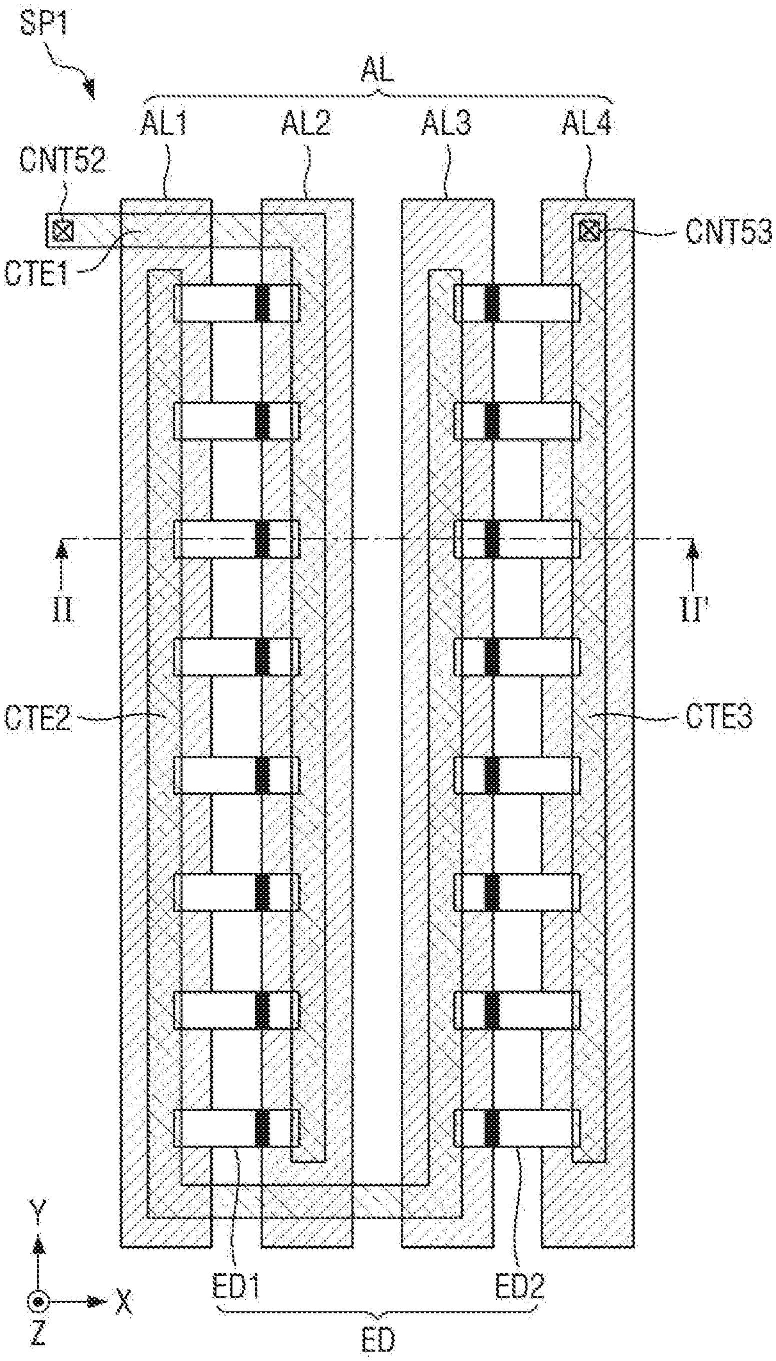
FIG. 13 is a plan view illustrating a light emitting element layer of the display device according to an embodiment.
Figure 14:
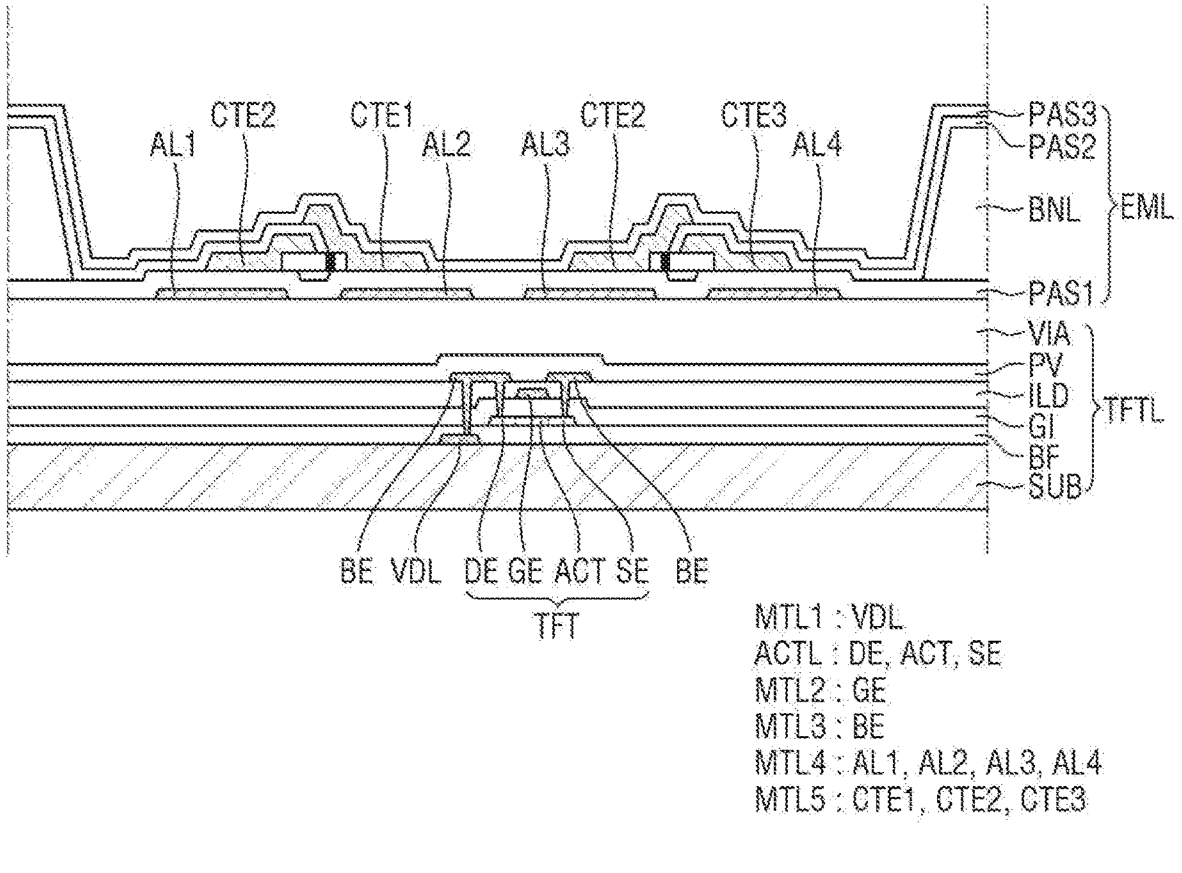
FIG. 14 is a schematic cross-sectional view taken along line II-II' of FIG. 13.

FIG. 13 is a plan view illustrating a light emitting element layer of the display device according to an embodiment, and FIG. 14 is a schematic cross-sectional view taken along line II-II' of FIG. 13. Here, FIG. 13 illustrates the first pixel SP1, and the second and third pixels SP2 and SP3 may be designed in the same manner as the first pixel SP1.

Referring to FIGS. 13 and 14, a light emitting element layer EML of the display device 10 may be disposed on a thin film transistor layer TFTL. The light emitting element layer EML may include first to fourth alignment lines AL1, AL2, AL3, and AL4, a first insulating layer PAS1, a bank layer BNL, first and second light emitting elements ED1 and ED2, first to third contact electrodes CTE1, CTE2, and CTE3, a second insulating layer PAS2, and a third insulating layer PAS3.

The fourth metal layer MTL4 may be disposed on the via layer VIA. The fourth metal layer MTL4 may include the first to fourth alignment lines AL1, AL2, AL3, and AL4. The first to fourth alignment lines AL1, AL2, AL3, and AL4 may extend in the second direction (Y-axis direction) and may be spaced apart from each other in the first direction (X-axis direction).

The first insulating layer PAS1 may be disposed on the first to fourth alignment lines AL1, AL2, AL3, and AL4. The first insulating layer PAS1 may insulate the first to fourth alignment lines AL1, AL2, AL3, and AL4 and the first and second light emitting elements ED1 and ED2 from each other.

The first light emitting elements ED1 may be aligned between the first and second alignment lines AL1 and AL2 on the first insulating layer PAS1. The second light emitting elements ED2 may be aligned between the third and fourth alignment lines AL3 and AL4 on the first insulating layer PAS1.

The fifth metal layer MTL5 may be disposed on the first insulating layer PAS1 and the light emitting elements ED. The fifth metal layer MTL5 may include the first to third contact electrodes CTE1, CTE2, and CTE3.

The first contact electrode CTE1 may be disposed on the second alignment line AL2 and be electrically connected to the pixel circuit of the first pixel SP1 through a fifty-second contact hole CNT52. For example, the first contact electrode CTE1 may receive the driving current passing through the first transistor ST1 of FIG. 5. The first contact electrode CTE1 may be electrically connected between the first transistor ST1 of the first pixel SP1 and an end of each of the first light emitting elements ED1. The first contact electrode CTE1 may correspond to an anode electrode of each of the first light emitting elements ED1, but may not be limited thereto.

The second contact electrode CTE2 may be disposed on the first to third alignment lines AL1, AL2, and AL3 and may be insulated from the first to third alignment lines AL1, AL2, and AL3. A first portion of the second contact electrode CTE2 may be disposed on the first alignment line AL1 and extend in the second direction (Y-axis direction). A second portion of the second contact electrode CTE2 may be bent from a lower side of the first portion and extend in the first direction (X-axis direction). A third portion of the second contact electrode CTE2 may be bent from a right side of the second portion and extend in the second direction (Y-axis direction), and may be disposed on the third alignment line AL3.

The second contact electrode CTE2 may be electrically connected between an opposite end of each of the first light emitting elements ED1 and an end of each of the second light emitting elements ED2. The second contact electrode CTE2 may correspond to the third node N3 of FIG. 5. The second contact electrode CTE2 may correspond to a cathode electrode of each of the first light emitting elements ED1, but may not be limited thereto. The second contact electrode CTE2 may correspond to an anode electrode of each of the second light emitting elements ED2, but may not be limited thereto.

The third contact electrode CTE3 may be disposed on the fourth alignment line AL4 and be electrically connected to the fourth alignment line AL4 through a fifty-third contact hole CNT53. The third contact electrode CTE3 may be electrically connected between an opposite end of each of the second light emitting elements ED2 and the fourth alignment line AL4. The fourth alignment line AL4 may receive the low potential voltage from the second voltage line VSL. The third contact electrode CTE3 may correspond to a cathode electrode of each of the second light emitting elements ED2, but may not be limited thereto.

The bank layer BNL may separate light emitting elements ED of the first to third pixels SP1, SP2, and SP3 from each other. The second insulating layer PAS2 may insulate the first and second contact electrodes CTE1 and CTE2 from each other on the first light emitting element ED1, and may insulate the second and third contact electrodes CTE2 and CTE3 from each other on the second light emitting element ED2. The third insulating layer PAS3 may be disposed on the first to third contact electrodes CTE1, CTE2, and CTE3 and the second insulating layer PAS2 to protect the light emitting element layer EML.

A thin film transistor TFT of the thin film transistor layer TFTL may include an active region ACT, a gate electrode GE, a drain electrode DE, and a source electrode SE. The drain electrode DE of the thin film transistor TFT may be electrically connected to the first voltage line VDL of the first metal layer MTL1 through a connection electrode BE.

Figure 15:
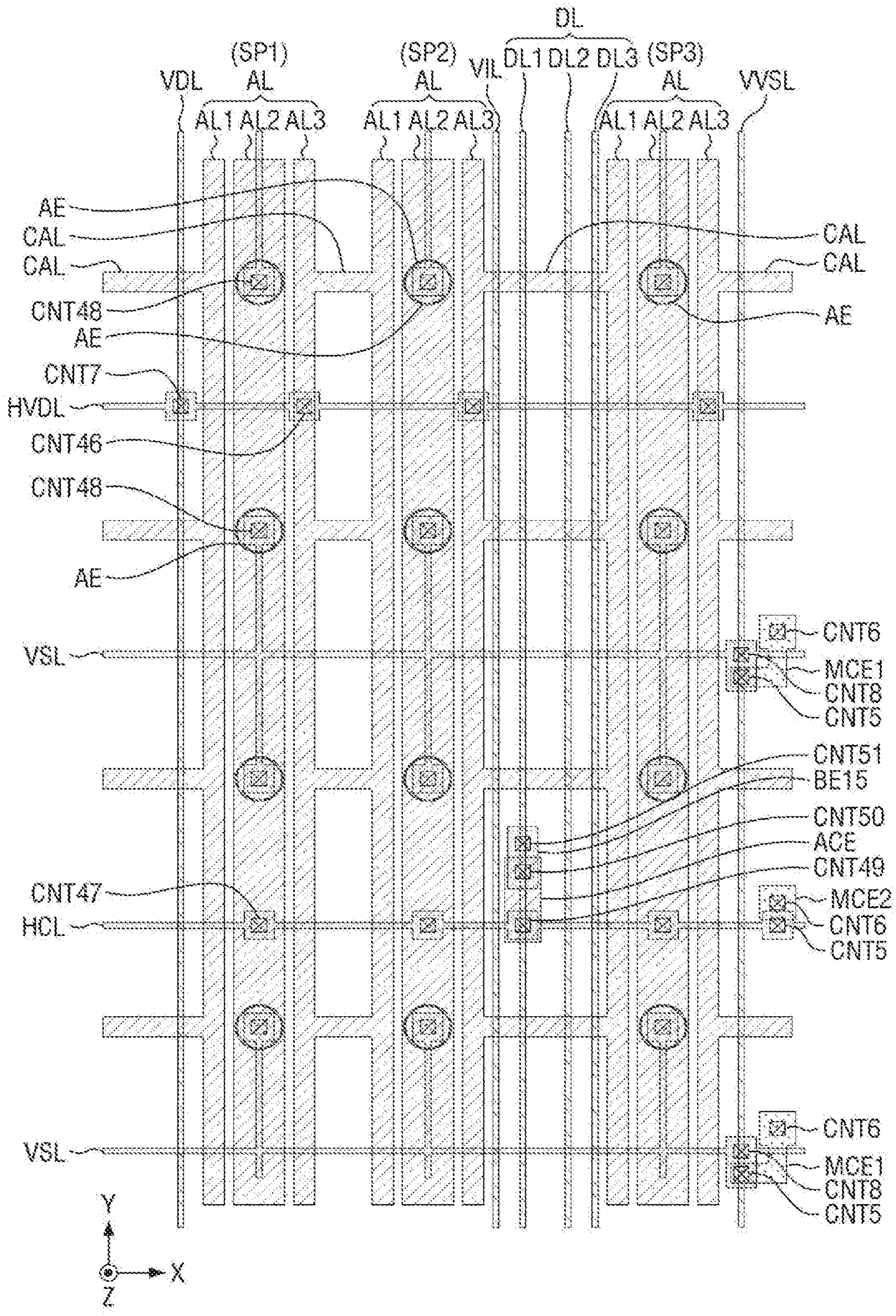
FIG. 15 is a plan view illustrating a connection relationship between alignment lines and a thin film transistor layer before alignment of light emitting elements in a display device according to an embodiment.
Figure 16:
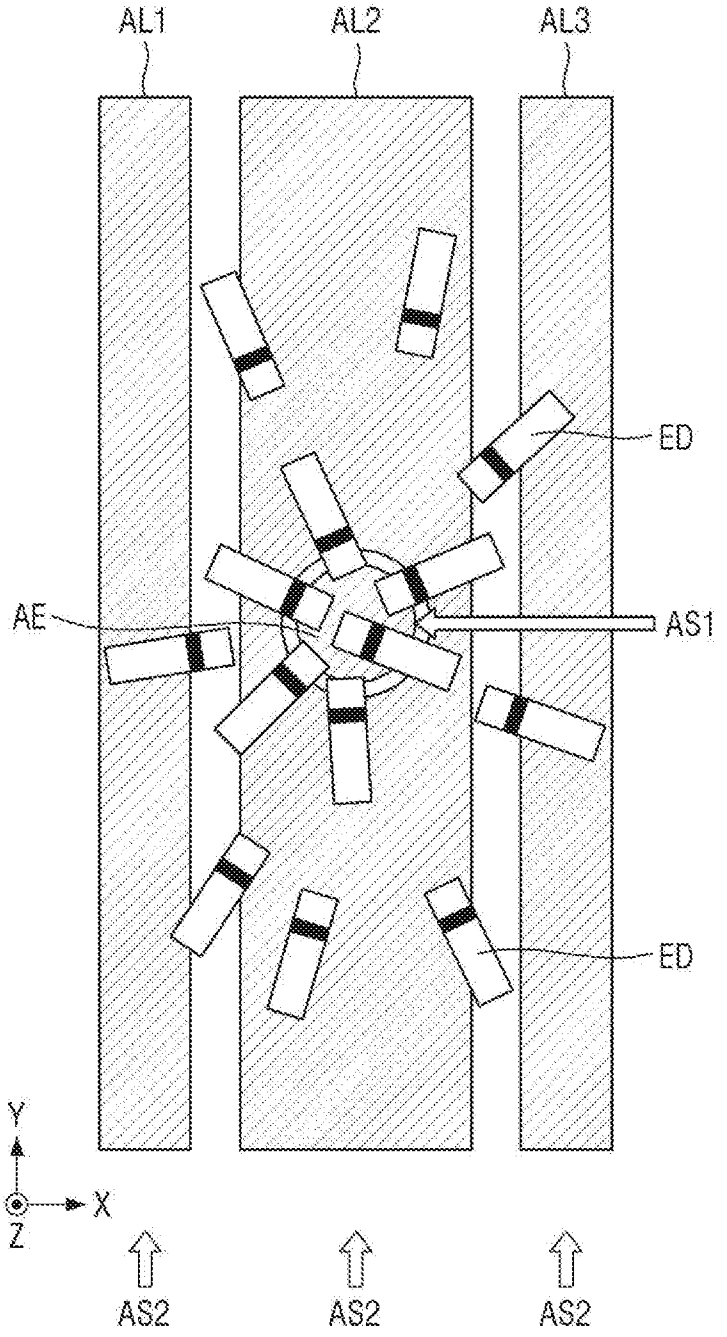
FIG. 16 is a view illustrating a primary alignment process of multiple light emitting elements in the display device according to an embodiment.

FIG. 15 is a plan view illustrating a connection relationship between alignment lines and a thin film transistor layer before alignment of light emitting elements in a display device according to an embodiment. FIG. 16 is a view illustrating a primary alignment process of multiple light emitting elements in the display device according to an embodiment, and FIG. 17 is a view illustrating a secondary alignment process of the light emitting elements in the display device according to an embodiment.

Figure 17:
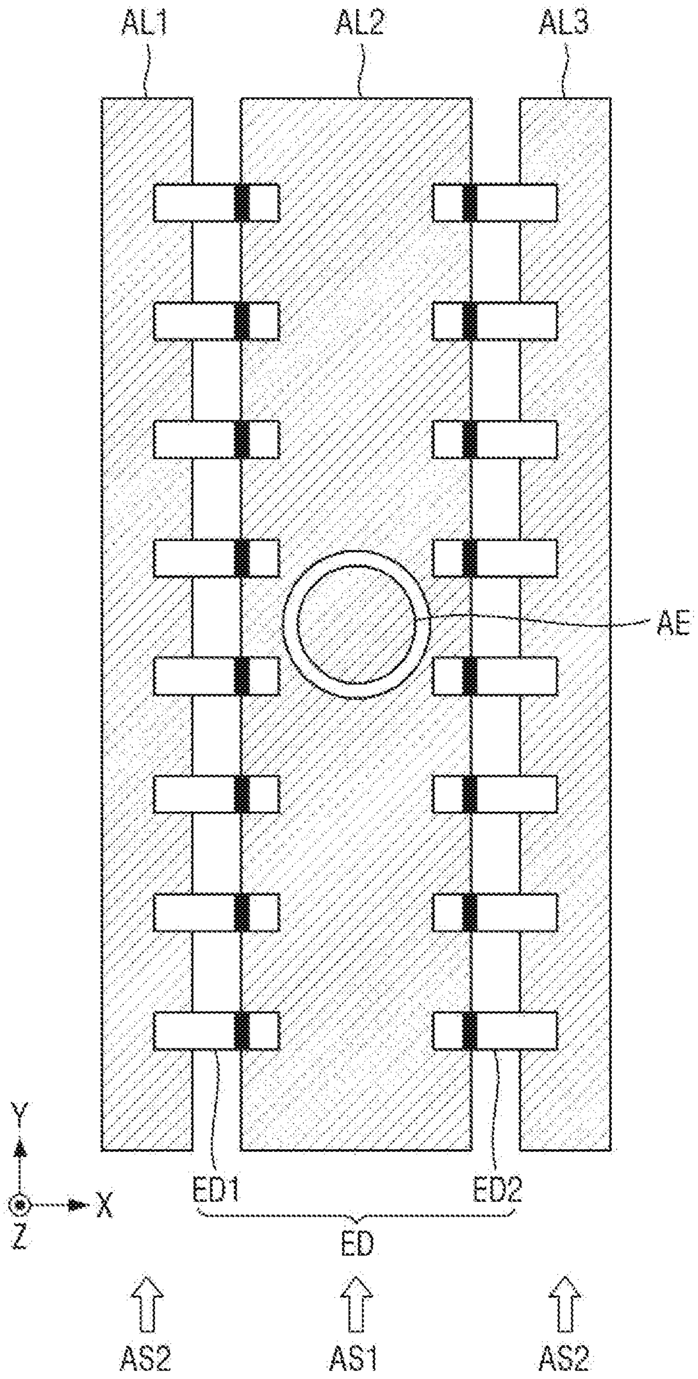
FIG. 17 is a view illustrating a secondary alignment process of the light emitting elements in the display device according to an embodiment.

Referring to FIGS. 15 to 17, each of the first to third pixels SP1, SP2, and SP3 may include an alignment line AL and an alignment electrode AE. The alignment line AL and the alignment electrode AE may be disposed at the fourth metal layer MTL4. The alignment line AL may include first to third alignment lines AL1, AL2, and AL3. The first to third alignment lines AL1, AL2, and AL3 may extend in the second direction (Y-axis direction) and may be spaced apart from each other in the first direction (X-axis direction). The first alignment line AL1 and a third alignment line AL3 of another adjacent pixel may be integral with each other through an alignment connection line CAL extending in the first direction (X-axis direction). For example, the third alignment line AL3 of the first pixel SP1 may be electrically connected to the first alignment line AL1 of the second pixel SP2 through the alignment connection line CAL. The third alignment line AL3 of the second pixel SP2 may be electrically connected to the first alignment line AL1 of the third pixel SP3 through the alignment connection line CAL.

In FIG. 15, the alignment lines AL of the first to third pixels SP1, SP2, and SP3 may not overlap the first voltage line VDL, the initialization voltage line VIL, the first to third data lines DL1, DL2, and DL3, and the vertical voltage line VVSL, but may not be limited thereto. As another example, at least one of the first to third alignment lines AL1, AL2, and AL3 of the first to third pixels SP1, SP2, and SP3 may overlap at least one of the first voltage line VDL, the initialization voltage line VIL, the first to third data lines DL1, DL2, and DL3, and the vertical voltage line VVSL.

The third alignment line AL3 of each of the first to third pixels SP1, SP2, and SP3 may be electrically connected to the horizontal voltage line HVDL of the third metal layer MTL3 through a forty-sixth contact hole CNT46. The horizontal voltage line HVDL may be electrically connected to the first voltage line VDL of the first metal layer MTL1 through the seventh contact hole CNT7. Accordingly, the third alignment line AL3 may receive an alignment signal through the first voltage line VDL. Accordingly, the first alignment line AL1 may be electrically connected to the third alignment line AL3 to receive an alignment signal through the first voltage line VDL.

The second alignment line AL2 of each of the first to third pixels SP1, SP2, and SP3 may be electrically connected to a horizontal connection line HCL of the third metal layer MTL3 through a forty-seventh contact hole CNT47. The horizontal connection line HCL may be electrically connected to an upper connection electrode ACE of the fourth metal layer MTL4 through a forty-ninth contact hole CNT49 and may be electrically connected to a second lower connection electrode MCE2 of the second metal layer MTL2 through a fifth contact hole CNT5. The upper connection electrode ACE may be electrically connected to a fifteenth connection electrode BE15 of the third metal layer MTL3 through a fiftieth contact hole CNT50, and the fifteenth connection electrode BE15 may be electrically connected to the first data line DL1 of the first metal layer MTL1 through a fifty-first contact hole CNT51. Accordingly, the second alignment line AL2 may receive an alignment signal through the first data line DL1. As another example, the second alignment line AL2 may be electrically connected to the initialization voltage line VIL, the second data line DL2, or the third data line DL3 to receive an alignment signal.

The alignment electrode AE of each of the first to third pixels SP1, SP2, and SP3 may be surrounded by the second alignment line AL2 so as to be spaced apart from each other. The alignment electrode AE may be electrically connected to the second voltage line VSL of the third metal layer MTL3 through the forty-eighth contact hole CNT48. The second voltage line VSL may include a first portion extending in the first direction (X-axis direction) and a second portion crossing the first portion and extending in the second direction (Y-axis direction), and the alignment electrode AE may be electrically connected to the second portion of the second voltage line VSL. The second voltage line VSL may be electrically connected to the vertical voltage line VVSL of the first metal layer MTL1 through the eighth contact hole CNT8 and may be electrically connected to a first lower connection electrode MCE1 of the second metal layer MTL2 through a fifth contact hole CNT5. Accordingly, the alignment electrode AE may receive an alignment signal through the vertical voltage line VVSL.

In FIG. 16, the alignment electrode AE of each of the first to third pixels SP1, SP2, and SP3 may receive a first alignment signal AS1, and the first to third alignment lines AL1, AL2, and AL3 of each of the first to third pixels SP1, SP2, and SP3 may receive a second alignment signal AS2. For example, the first alignment signal AS1 may be an AC signal having a predetermined frequency, and the second alignment signal AS2 may be a ground signal, but the disclosure may not be limited thereto. The alignment electrode AE receives the first alignment signal AS1 and the first to third alignment lines AL1, AL2, and AL3 receive the second alignment signal AS2, such that an electric field may be formed from the alignment electrode AE toward the first to third alignment lines AL1, AL2, and AL3. For example, multiple light emitting elements ED may be jetted onto the alignment lines AL of the first to third pixels SP1, SP2, and SP3 through an inkjet printing process, and the light emitting elements ED dispersed in ink may be aligned by receiving a dielectrophoresis force by an electric field. Accordingly, the light emitting elements ED may be aligned toward the alignment electrode AE on the first to third alignment lines AL1, AL2, and AL3.

In FIG. 17, the second alignment line AL2 of each of the first to third pixels SP1, SP2, and SP3 may receive the first alignment signal AS1, and the first and third alignment lines AL1 and AL3 of each of the first to third pixels SP1, SP2, and SP3 may receive the second alignment signal AS2. The alignment electrode AE may not receive a separate alignment signal and may have a floating state. The second alignment line AL2 receives the first alignment signal AS1 and the first and third alignment lines AL1 and AL3 receive the second alignment signal AS2, such that an electric field may be formed from the second alignment line AL2 to the first or third alignment line AL1 or AL3. Accordingly, multiple light emitting elements ED1 may be aligned toward the first direction (X-axis direction) between the first and second alignment lines AL1 and AL2, and multiple second light emitting elements ED2 may be aligned toward a direction opposite to the first direction (X-axis direction) between the second and third alignment lines AL2 and AL3.

In the display device 10, by aligning the light emitting elements ED through the primary alignment process of FIG. 16 and the secondary alignment process of FIG. 17 to prevent the light emitting elements ED from being partially concentrated, the light emitting elements ED may be evenly distributed. Accordingly, the display device 10 may improve display quality by preventing dark spots.

Figure 18:
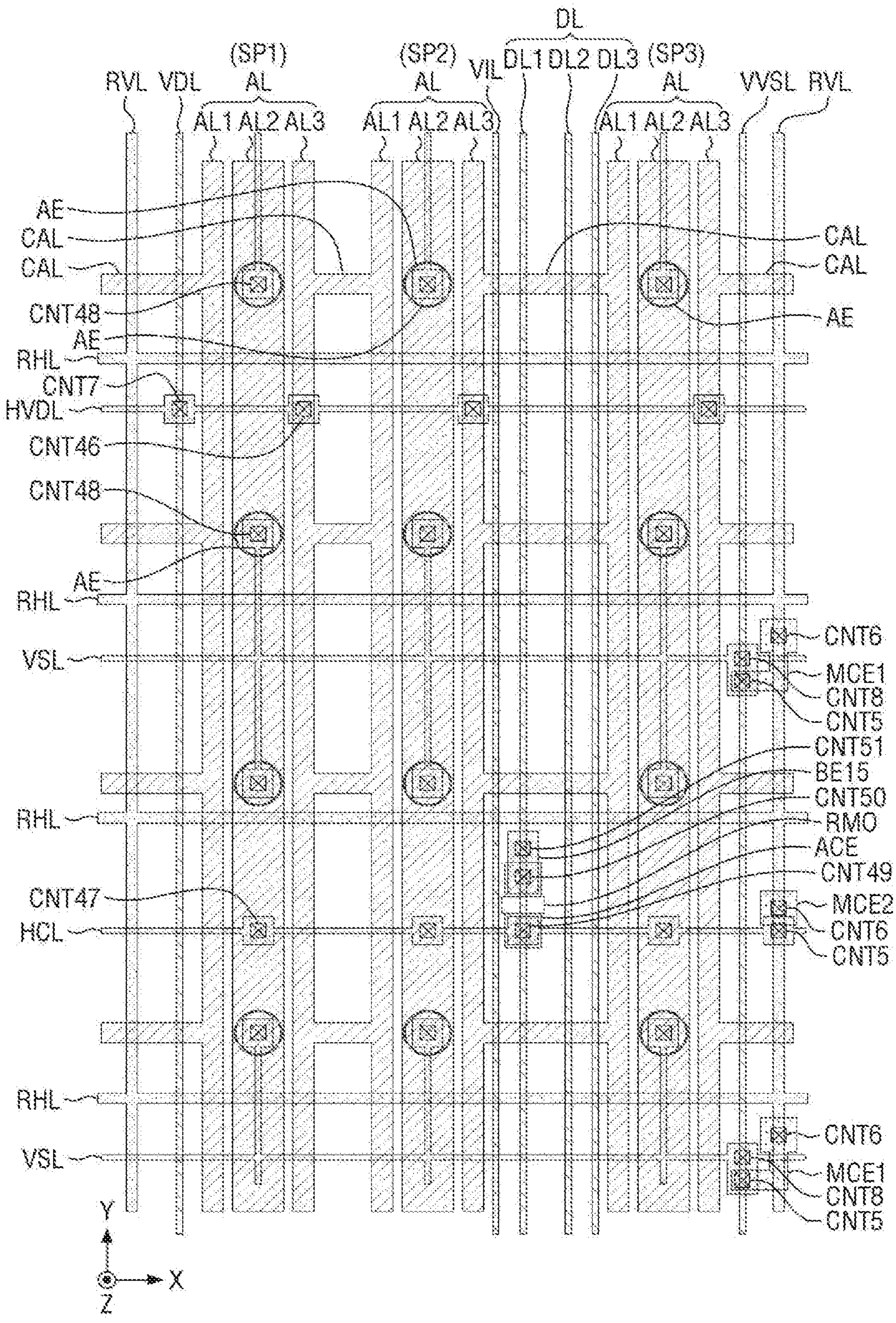
FIG. 18 is a plan view illustrating a connection relationship between the alignment lines and the thin film transistor layer after the alignment of the light emitting elements in the display device according to an embodiment.

FIG. 18 is a plan view illustrating a connection relationship between the alignment lines and the thin film transistor layer after the alignment of the light emitting elements in the display device according to an embodiment. Referring to FIG. 18, first and second upper voltage lines RVL and RHL may be disposed at the fifth metal layer MTL5 on the fourth metal layer MTL4. The fifth metal layer MTL5 may be formed after the light emitting elements ED may be aligned.

Multiple first upper voltage lines RVL may extend in the second direction (Y-axis direction) and may be spaced apart from each other in the first direction (X-axis direction). The first upper voltage line RVL may be electrically connected to the first lower connection electrode MCE1 of the second metal layer MTL2 through a sixth contact hole CNT6. The first lower connection electrode MCE1 may be electrically connected to the second voltage line VSL of the third metal layer MTL3 through the fifth contact hole CNT5. The second voltage line VSL may be electrically connected to the vertical voltage line VVSL of the first metal layer MTL1 through the eighth contact hole CNT8. Accordingly, the first upper voltage line RVL may receive the low potential voltage from the vertical voltage line VVSL.

The first upper voltage line RVL may be electrically connected to the second lower connection electrode MCE2 of the second metal layer MTL2 through a sixth contact hole CNT6. The second lower connection electrode MCE2 may be electrically connected to the horizontal connection line HCL of the third metal layer MTL3 through the fifth contact hole CNT5. The upper connection electrode ACE may be cut by a separator part RMO. Accordingly, the horizontal connection line HCL may be electrically insulated from the first data line DL1 and may receive the low potential voltage from the first upper voltage line RVL.

Multiple second upper voltage lines RHL may extend in the first direction (X-axis direction) and may be spaced apart from each other in the second direction (Y-axis direction). The second upper voltage lines RHL may be integral with the first upper voltage lines RVL. Accordingly, the second upper voltage line RHL may receive the low potential voltage from the vertical voltage line VVSL. The second upper voltage lines RHL may cross the first to third alignment lines AL1, AL2, and AL3.

The first and third alignment lines AL1 and AL3 of the display device 10 may be electrically connected to the horizontal voltage line HVDL and the first voltage line VDL to receive the high potential voltage, and the second alignment line AL2 of the display device 10 may be electrically connected to the vertical voltage line VVSL, the second voltage line VSL, the horizontal connection line HCL, and the first and second upper voltage lines RVL and RHL to receive the low potential voltage. The first and third alignment lines AL1 and AL3 may be electrically connected to high potential lines (e.g., the horizontal voltage line HVDL and the first voltage line VDL) having a mesh structure, and the second alignment line AL2 may be electrically connected to low potential lines (e.g., the vertical voltage line VVSL and the second voltage line VSL or the first and second upper voltage lines RVL and RHL) having a mesh structure. Accordingly, all of the alignment lines AL of the display device 10 may be electrically connected to the high potential lines or the low potential lines having the mesh structure to secure overlapping connections and prevent an IR drop.

Figure 19:
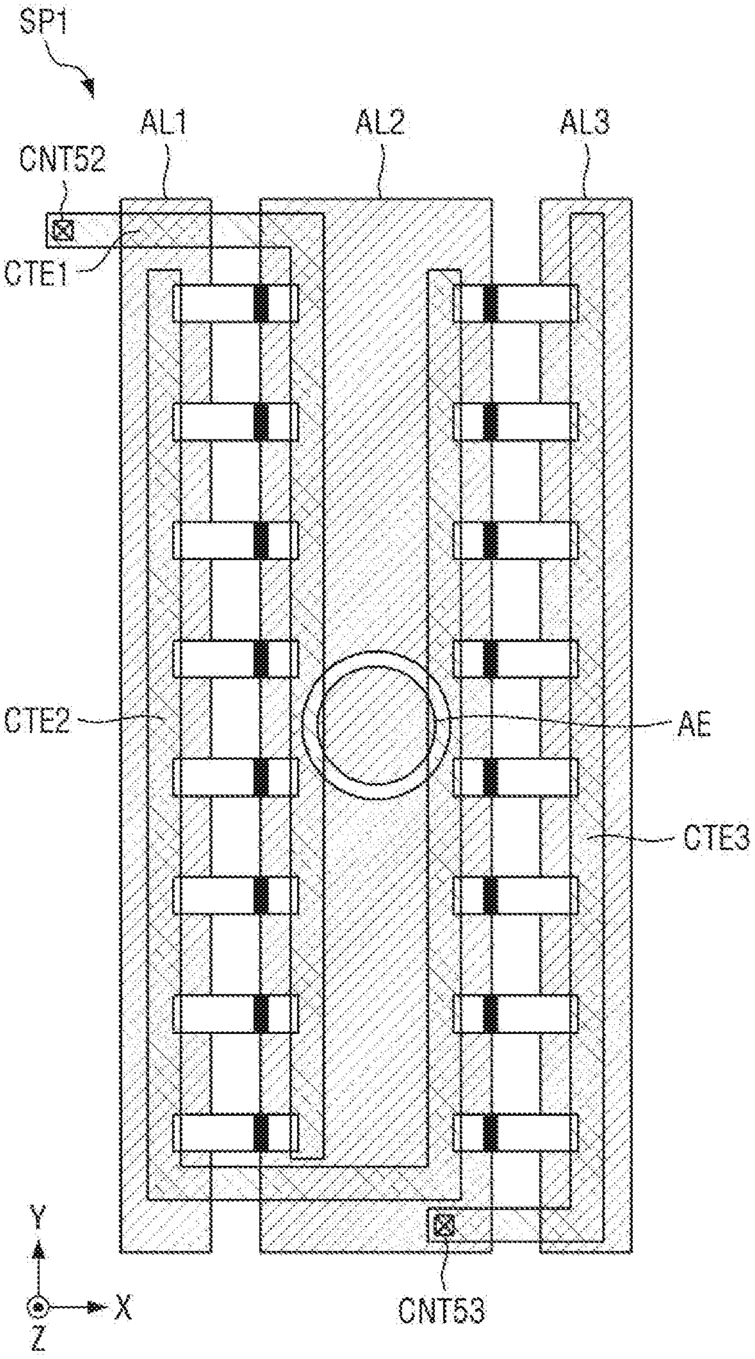
FIG. 19 is a plan view illustrating a light emitting element layer of the display device according to an embodiment.

FIG. 19 is a plan view illustrating a light emitting element layer of the display device according to an embodiment. Here, FIG. 19 illustrates the first pixel SP1, and the second and third pixels SP2 and SP3 may be designed in the same manner as the first pixel SP1. Referring to FIG. 19, the light emitting element layer EML may include first to third alignment lines AL1, AL2, and AL3, an alignment electrode AE, first and second light emitting elements ED1, ED2, and first to third contact electrodes CTE1, CTE2, and CTE3.

The fourth metal layer MTL4 may include the first to third alignment lines AL1, AL2, and AL3. The first to third alignment lines AL1, AL2, and AL3 may extend in the second direction (Y-axis direction) and may be spaced apart from each other in the first direction (X-axis direction). The first light emitting elements ED1 may be aligned between the first and second alignment lines AL1 and AL2. The second light emitting elements ED2 may be aligned between the second and third alignment lines AL2 and AL3.

The fifth metal layer MTL5 may include the first to third contact electrodes CTE1, CTE2, and CTE3. The first contact electrode CTE1 may be disposed on the second alignment line AL2 and be electrically connected to the pixel circuit of the first pixel SP1 through a fifty-second contact hole CNT52. For example, the first contact electrode CTE1 may receive the driving current passing through the first transistor ST1 of FIG. 5. The first contact electrode CTE1 may be electrically connected between the first transistor ST1 of the first pixel SP1 and an end of each of the first light emitting elements ED1. The first contact electrode CTE1 may correspond to an anode electrode of each of the first light emitting elements ED1, but may not be limited thereto.

The second contact electrode CTE2 may be disposed on the first and second alignment lines AL1 and AL2 and may be insulated from the first and second alignment lines AL1 and AL2. A first portion of the second contact electrode CTE2 may be disposed on the first alignment line AL1 and extend in the second direction (Y-axis direction). A second portion of the second contact electrode CTE2 may be bent from a lower side of the first portion and extend in the first direction (X-axis direction). A third portion of the second contact electrode CTE2 may be bent from a right side of the second portion and extend in the second direction (Y-axis direction), and may be disposed on the second alignment line AL2.

The second contact electrode CTE2 may be electrically connected between an opposite end of each of the first light emitting elements ED1 and an end of each of the second light emitting elements ED2. The second contact electrode CTE2 may correspond to the third node N3 of FIG. 5. The second contact electrode CTE2 may correspond to a cathode electrode of each of the first light emitting elements ED1, but may not be limited thereto. The second contact electrode CTE2 may correspond to an anode electrode of each of the second light emitting elements ED2, but may not be limited thereto.

The third contact electrode CTE3 may be disposed on the third alignment line AL3, and be electrically connected to the second alignment line AL2 through a fifty-third contact hole CNT53. The third contact electrode CTE3 may be electrically connected between an opposite end of each of the second light emitting elements ED2 and the second alignment line AL2. The second alignment line AL2 may receive the low potential voltage from the second voltage line VSL. The third contact electrode CTE3 may correspond to a cathode electrode of each of the second light emitting elements ED2, but may not be limited thereto.

While embodiments of the invention are described with reference to the attached drawings, those with ordinary skill in the technical field invention pertains will be understood that the invention can be carried out in other specific forms without changing the technical idea or essential features. Accordingly, the above-described embodiments should be considered in descriptive sense only and not for purposes of limitation.

What is claimed is:

1. A display device comprising:

a first voltage line, first and second data lines, and a vertical voltage line disposed on a substrate and extending in parallel in a first direction;

a horizontal voltage line, a second voltage line, and first and second horizontal connection lines disposed on the first voltage line and extending in parallel in a second direction intersecting the first direction;

first to fourth alignment lines disposed on the horizontal voltage line and extending in parallel in the first direction;

a plurality of first light emitting elements aligned between the first and second alignment lines; and a plurality of second light emitting elements aligned between the third and fourth alignment lines, wherein the first voltage line, the horizontal voltage line, and the first alignment line are electrically connected to each other, the first horizontal connection line and the second alignment line are electrically connected to each other, the second horizontal connection line and the third alignment line are electrically connected to each other, and the vertical voltage line, the second voltage line, and the fourth alignment line are electrically connected to each other.

2. The display device of claim 1, further comprising:

a first upper voltage line disposed on the first to fourth alignment lines and extending in the first direction; and a second upper voltage line extending in the second direction, the second upper voltage line and the first upper voltage line being disposed on a same layer, wherein the first and second upper voltage lines are integral with each other.

3. The display device of claim 2, wherein the first and second upper voltage lines are electrically connected to the second voltage line and the first and second horizontal connection lines.

4. The display device of claim 3, wherein the first upper voltage line is electrically connected to the second voltage line through a first lower connection electrode disposed at a layer between the second voltage line and the vertical voltage line.

5. The display device of claim 1, wherein during an alignment of the plurality of first and the plurality of second light emitting elements, the first horizontal connection line and the second alignment line are electrically connected to the first data line, and the second horizontal connection line and the third alignment line are electrically connected to the second data line.

6. The display device of claim 5, wherein during a primary alignment of the first and second light emitting elements, the first and second alignment lines receive a first alignment signal and the third and fourth alignment lines receive a second alignment signal different from the first alignment signal.

7. The display device of claim 6, wherein during a secondary alignment of the first and second light emitting elements, the second and third alignment lines receive the first alignment signal and the first and fourth alignment lines receive the second alignment signal.

8. The display device of claim 1, further comprising:

an initialization voltage line extending parallel to the first data line, the initialization voltage line and the first data line being disposed on a same layer;

a first transistor electrically connected between the first voltage line and the plurality of first light emitting elements;

a second transistor electrically connected between the first data line and a gate electrode of the first transistor; and a third transistor electrically connected between the initialization voltage line and the plurality of first light emitting elements.

9. The display device of claim 8, further comprising:

a first contact electrode disposed on the first to fourth alignment lines and electrically connected between the first transistor and the plurality of first light emitting elements;

a second contact electrode electrically connected between the plurality of first light emitting elements and the plurality of second light emitting elements; and a third contact electrode electrically connected between the plurality of second light emitting elements and the fourth alignment line.

10. The display device of claim 1, wherein after an alignment of the first and second light emitting elements, the first horizontal connection line and the first data line are electrically insulated from each other and the second horizontal connection line and the second data line are electrically insulated from each other.

* * * * *